(12) United States Patent
Yang et al.

(10) Patent No.: US 11,957,062 B2
(45) Date of Patent: Apr. 9, 2024

(54) MEMORY

(71) Applicant: Huawei Technologies Co., Ltd., Shenzhen (CN)

(72) Inventors: Wen Yang, Shenzhen (CN); Yanxiang Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 656 days.

(21) Appl. No.: 17/120,667

(22) Filed: Dec. 14, 2020

(65) Prior Publication Data

US 2021/0098691 A1 Apr. 1, 2021

Related U.S. Application Data

(63) Continuation of application No. PCT/CN2018/091295, filed on Jun. 14, 2018.

(51) Int. Cl.
*H01L 43/02* (2006.01)
*H01L 27/22* (2006.01)
(Continued)

(52) U.S. Cl.
CPC ............. *H10N 50/80* (2023.02); *H10B 61/22* (2023.02)

(58) Field of Classification Search
CPC ........ H10N 50/80; H10N 50/85; H10N 50/00; H10B 61/22; H10B 61/00; H10B 61/20;
(Continued)

(56) References Cited

U.S. PATENT DOCUMENTS 6,331,943 B1 12/2001 Naji et al.
6,365,419 B1 4/2002 Durlam et al.
(Continued)

FOREIGN PATENT DOCUMENTS

CN 1444274 A 9/2003
CN 1499519 A 5/2004
(Continued)

OTHER PUBLICATIONS

Shum, D., et al., "CMOS-embedded STT-MRAM Arrays in 2x nm Nodes for GP-MCU applications," 2017 Symposium on VLSI Technology, Aug. 3, 2017, 2 pages.
(Continued)

*Primary Examiner* — Nikolay K Yushin
(74) *Attorney, Agent, or Firm* — Conley Rose, P.C.

(57) ABSTRACT

A memory includes a transistor and a magnetic tunnel junction (MTJ) storage element, a bottom electrode of the MTJ storage element is electrically connected to a drain electrode of the transistor using a conduction structure, wiring layers are disposed between the transistor and the MTJ storage element in the storage area, and a dielectric layer is filled between adjacent wiring layers, the conduction structure includes a first conduction part, and the first conduction part includes a first metal wire, a second metal wire, and a first via hole, the wiring layers comprise a first wiring layer, a second wiring layer, and a third wiring layer, the first via hole penetrates a dielectric layer and the third wiring layer that are located between the first wiring layer and the second wiring layer.

20 Claims, 20 Drawing Sheets

(51) Int. Cl.
*H10B 61/00* (2023.01)
*H10N 50/80* (2023.01)

(58) Field of Classification Search
CPC ....... H10B 61/10; G11C 11/16; G11C 11/161; G11C 11/1659; G11C 11/18
See application file for complete search history.

(56) References Cited

U.S. PATENT DOCUMENTS

| | | | |
|---|---|---|---|
| 9,559,294 B2* | 1/2017 | Hsu | .......... H10N 50/01 |
| 9,704,919 B1 | 7/2017 | Lu et al. | |
| 2003/0146515 A1 | 8/2003 | Kajiyama | |
| 2003/0214862 A1 | 11/2003 | Asao et al. | |
| 2004/0075125 A1 | 4/2004 | Asao | |
| 2004/0090822 A1 | 5/2004 | Yoo et al. | |
| 2004/0211995 A1 | 10/2004 | Park et al. | |
| 2005/0122772 A1 | 6/2005 | Kerszykowski et al. | |
| 2006/0097298 A1 | 5/2006 | Ho | |
| 2009/0174015 A1 | 7/2009 | Gu et al. | |
| 2015/0060967 A1 | 3/2015 | Yokoyama et al. | |
| 2016/0225979 A1* | 8/2016 | Hsu | .......... H10N 50/10 |
| 2016/0254318 A1 | 9/2016 | Lu et al. | |
| 2017/0040046 A1 | 2/2017 | Fu et al. | |

FOREIGN PATENT DOCUMENTS

| | | |
|---|---|---|
| CN | 1551358 A | 12/2004 |
| CN | 101911326 A | 12/2010 |
| CN | 102314927 A | 1/2012 |
| CN | 103021999 A | 4/2013 |
| CN | 105096963 A | 11/2015 |
| CN | 107258016 A | 10/2017 |

OTHER PUBLICATIONS

Kang, S.H., et al., "MRAM: Enabling a sustainable device for pervasive system architectures and applications," 2017 IEEE International Electron Devices Meeting (IEDM), Jan. 25, 2018, 4 pages.

Pal, S., et al., "Supervia: Relieving Routing Congestion using Double-height Vias," eScholarship, University of California, 2017, 9 pages.

Zhang, K.., "Memories for the Future: device, technologies, and architecture," Sponsored by Electron Devices Society of IEEE, San Francisco, California, Dec. 3, 2017, 343 pages.

* cited by examiner

MEMORY

CROSS-REFERENCE TO RELATED APPLICATIONS

This application is a continuation application of International Patent Application No. PCT/CN2018/091295 filed on Jun. 14, 2018, the disclosure of which is hereby incorporated by reference in its entirety.

TECHNICAL FIELD

This application relates to the field of semiconductor technologies, and in particular, to a memory.

BACKGROUND

A spin transfer torque-magnetic random access memory (STT-MRAM) is a new memory that has advantages of non-volatile property, fast working speed, infinite times of erasing and writing, and the like. Compared with a static random-access memory (SRAM), the STT-MRAM has great advantages in terms of static power consumption and area, in addition to having high performance of the SRAM. With the progress of a semiconductor process, the STT-MRAM faces an increasingly high integration requirement and various electrical problems caused by high integration.

SUMMARY

This application provides a memory, to improve integration density of the memory.

To achieve the foregoing objective, the following technical solutions are used in this application.

A first aspect of this application provides a memory, including a storage area, where the storage area includes several storage units disposed on a substrate, each storage unit includes a transistor disposed on the substrate and a magnetic tunnel junction (MTJ) storage element electrically connected to the transistor, and the MTJ storage element includes a bottom electrode, a top electrode, and an MTJ located between the two. The bottom electrode is electrically connected to a drain electrode of the transistor by using a conduction structure. A plurality of wiring layers are disposed between the transistor and the MTJ storage element in the storage area, and a dielectric layer is filled between adjacent wiring layers. The conduction structure includes a first conduction part, and the first conduction part includes a first metal wire, a second metal wire, and a first via hole between the first metal wire and the second metal wire. The plurality of wiring layers include a first wiring layer, a second wiring layer, and a third wiring layer, and the third wiring layer is disposed between the first wiring layer and the second wiring layer. The first wiring layer includes the first metal wire, the second wiring layer includes the second metal wire, and the first via hole penetrates a dielectric layer and the third wiring layer that are located between the first wiring layer and the second wiring layer. A first connection passage is disposed in the first via hole, the first connection passage is directly connected to the first metal wire and the second metal wire, and the first connection passage is not directly connected to a metal wire at the third wiring layer.

In the conduction structure configured to electrically connect the drain electrode of the transistor to the bottom electrode of the MTJ storage element, the first via hole of the first conduction part penetrates the third wiring layer located between the first wiring layer and the second wiring layer, and the first connection passage disposed in the first via hole is directly connected to the first metal wire and the second metal wire. Therefore, compared with the case that the first metal wire and the second metal wire are electrically connected by using the third metal wire located between the first metal wire and the second metal wire and disposed at the third wiring layer, the third metal wire is omitted in this application. Therefore, space occupied by the third metal wire can be released. On this basis, in one aspect, the space released from the third metal wire may be used for circuit wiring, so as to ease overall circuit wiring congestion. In another aspect, after the third metal wire is omitted, when the minimum distance of wiring is met, an area occupied by each storage unit can be reduced, and therefore, integration density of the memory can be improved. In still another aspect, resistance of the via hole mainly comes from an interface between the via hole and a metal wire in contact with a lower part (close to the substrate) of the via hole. In this application, because the first via hole crosses the third wiring layer, no interface exists between the first via hole and the metal wire at the third wiring layer, lower resistance is caused, and a parasitic capacitance can be reduced, thereby improving overall performance of the memory.

With reference to the first aspect, in a possible implementation, the transistor is configured to control writing, changing, or reading of information in the storage unit.

With reference to the first aspect, in another possible implementation, a second via hole is disposed in the storage area, and the second via hole penetrates the third wiring layer. The first via hole is adjacent to the second via hole, and no metal wire exists on a part that is of the third wiring layer and that is located between the first via hole and the second via hole.

With reference to the first aspect, in another possible implementation, a third via hole is disposed in the storage area, one end of the third via hole starts from the third wiring layer, a third connection passage in the third via hole is connected to the metal wire at the third wiring layer, and the third via hole is adjacent to the first via hole.

With reference to the first aspect, in another possible implementation, transistors in two adjacent storage elements share a drain electrode. Therefore, integration density of the memory can be further improved.

With reference to the first aspect, in another possible implementation, there are at least two first conduction parts, and all the first conduction parts are disposed along a thickness direction of the substrate.

On this basis, optionally, any two adjacent first conduction parts share the second metal wire or the first metal wire.

With reference to the first aspect, in another possible implementation, the conduction structure further includes a second conduction part, and the second conduction part is disposed between the first conduction part and the MTJ storage element. The second conduction part includes a fourth metal wire and a fourth via hole. The plurality of wiring layers further include a fourth wiring layer, and the fourth wiring layer includes the fourth metal wire. The fourth via hole penetrates a dielectric layer between the fourth wiring layer and the first conduction part. A fourth connection passage is disposed in the fourth via hole, and the fourth connection passage is directly connected to the fourth metal wire and the first metal wire or the second metal wire adjacent to the fourth metal wire.

With reference to the first aspect, in another possible implementation, the conduction structure further includes a third conduction part, and the third conduction part is disposed between the first conduction part and the transistor.

The third conduction part includes a fifth via hole, and the fifth via hole penetrates a dielectric layer between the first conduction part and the drain electrode of the transistor. A fifth connection passage is disposed in the fifth via hole, and the fifth connection passage is directly connected to the drain electrode of the transistor and the first metal wire or the second metal wire adjacent to the drain electrode of the transistor.

With reference to the first aspect and the foregoing possible implementations, in another possible implementation, the first via hole penetrates one or two third wiring layers between the first wiring layer and the second wiring layer. When there are at least two first conduction parts of the conduction structure, a first via hole of each first conduction part penetrates one or two third wiring layers.

With reference to the first aspect and the foregoing possible implementations, in another possible implementation, in each first conduction part, the first connection passage and a first metal wire or a second metal wire that is located on a side of the first connection passage away from the substrate and that is directly connected to the first connection passage form an integrated structure. A diffusion barrier layer is disposed on a side surface and a bottom surface of the integrated structure, and the bottom surface is close to the substrate. A part of the diffusion barrier layer that is located on a side surface and a bottom surface of the first connection passage is located in the first via hole.

On this basis, optionally, when the conduction structure further includes the second conduction part, the fourth connection passage and the fourth metal wire form an integrated structure. On this basis, the diffusion barrier layer may be further disposed on a side surface and a bottom surface of the integrated structure including the fourth connection passage and the fourth metal wire, and the bottom surface is close to the substrate. A part of the diffusion barrier layer that is located on a side surface and a bottom surface of the fourth connection passage is located in the fourth via hole.

Optionally, when the conduction structure further includes the third conduction part, the fifth connection passage and the first metal wire or the second metal wire that is located on a side of the fifth connection passage away from the substrate and that is directly connected to the fifth connection passage form an integrated structure. The diffusion barrier layer may be further disposed on a side surface and a bottom surface of the integrated structure including the fifth connection passage and one of the first metal wire and the second metal wire, and the bottom surface is close to the substrate. A part of the diffusion barrier layer that is located on a side surface and a bottom surface of the fifth connection passage is located in the fifth via hole.

With reference to the first aspect, in another possible implementation, a dielectric layer disposed between adjacent wiring layers includes at least a first sublayer and a second sublayer, where the second sublayer is an etch barrier layer and is disposed on a side of the first sublayer close to the substrate.

On this basis, optionally, a material of the first sublayer is a dielectric material of a low dielectric constant or an ultra-low dielectric constant.

With reference to the first aspect and the foregoing possible implementations, in another possible implementation, the first metal wire and the second metal wire are parallel in a length direction.

Further, optionally, a length direction of the fourth metal wire is parallel to length directions of the first metal wire and the second metal wire. On this basis, in a width direction of the first metal wire and the second metal wire, a size of the storage unit is reduced, thereby improving integration density of the memory.

A second aspect of this application provides another memory, including a storage area, where the storage area includes several storage units disposed on a substrate, each storage unit includes a transistor disposed on the substrate and an MTJ storage element electrically connected to the transistor, and the MTJ storage element includes a bottom electrode, a top electrode, and an MTJ located between the bottom electrode and the top electrode. The bottom electrode is electrically connected to a drain electrode of the transistor by using a conduction structure. A plurality of wiring layers are disposed between the transistor and the MTJ storage element in the storage area, and a dielectric layer is filled between adjacent wiring layers and between a wiring layer closest to the transistor and the transistor. The conduction structure includes a first conduction part. The first conduction part includes a first metal wire and a first via hole. The plurality of wiring layers include a first wiring layer and a second wiring layer, and the second wiring layer is disposed between the first wiring layer and the transistor. The first wiring layer includes the first metal wire, and the first via hole penetrates a dielectric layer and the second wiring layer that are located between the first wiring layer and the transistor. A first connection passage is disposed in the first via hole, the first connection passage is directly connected to the first metal wire and the drain electrode of the transistor, and the first connection passage is not directly connected to a metal wire at the second wiring layer.

In the conduction structure configured to electrically connect the drain electrode of the transistor to the bottom electrode of the MTJ storage element, the first via hole of the first conduction part penetrates the second wiring layer between the first wiring layer and the transistor, so that the first connection passage disposed in the first via hole is directly connected to the first metal wire and the drain electrode of the transistor. Therefore, compared with the case that the first metal wire and the drain electrode of the transistor are electrically connected by using the metal wire that is located between the first metal wire and the drain electrode of the transistor and that is disposed at the second wiring layer, space occupied by the metal wire at the second wiring layer can be released in this application. On this basis, in one aspect, the space released by the second wiring layer may be used for circuit wiring, so as to ease overall circuit wiring congestion. In another aspect, after the metal wire that is on the second wiring layer and that is used to connect the drain electrode to the first metal wire is omitted, when a minimum distance of wiring is met, an area occupied by each storage unit can be reduced, and therefore, integration density of the memory can be improved. In still another aspect, resistance of the via hole mainly comes from an interface between the via hole and a metal in contact with a lower part (close to the substrate) of the via hole. In this application, because the first via hole crosses the second wiring layer, no interface exists between the first via hole and the metal wire at the second wiring layer, lower resistance is caused, and a parasitic capacitance can be reduced, thereby improving overall performance of the memory.

With reference to the second aspect, in a possible implementation, the transistor is configured to control writing, changing, or reading of information in the storage unit.

With reference to the second aspect, in another possible implementation, transistors in two adjacent storage elements share a drain electrode. Therefore, integration density of the memory can be further improved.

With reference to the second aspect, in another possible implementation, there are at least two first conduction parts, and all the first conduction parts are disposed along a thickness direction of the substrate, and any adjacent first conduction parts are directly connected.

With reference to the second aspect, in another possible implementation, the conduction structure further includes a second conduction part. The second conduction part is disposed on a side of the first conduction part away from the substrate. The second conduction part includes a fourth metal wire and a fourth via hole. The plurality of wiring layers further include a fourth wiring layer, and the fourth wiring layer includes the fourth metal wire. The fourth via hole penetrates a dielectric layer between the fourth wiring layer and the first conduction part. A fourth connection passage is disposed in the fourth via hole, and the fourth connection passage is directly connected to the fourth metal wire and the first metal wire.

On this basis, optionally, there are at least two second conduction parts, and all the second conduction parts are disposed along the thickness direction of the substrate. In all the second conduction parts, a fourth connection passage in a second conduction part closest to the first conduction part is directly connected to the fourth metal wire and the first metal wire. In any adjacent second conduction parts, a fourth metal wire and a fourth connection passage that separately belong to the adjacent second conduction parts are directly connected.

Optionally, a length direction of the fourth metal wire is parallel to a length direction of the first metal wire. On this basis, in a width direction of the first metal wire, a size of the storage unit is reduced, thereby improving integration density of the memory.

With reference to the second aspect and the foregoing possible implementations, in another possible implementation, the first via hole penetrates one or two second wiring layers between the first wiring layer and the transistor.

With reference to the second aspect and the foregoing possible implementations, in another possible implementation, in each first conduction part, the first connection passage and the first metal wire that is directly connected to the first connection passage form an integrated structure. A diffusion barrier layer is disposed on a side surface and a bottom surface of the integrated structure, and the bottom surface is close to the substrate. A part of the diffusion barrier layer that is located on a side surface and a bottom surface of the first connection passage is located in the first via hole.

On this basis, when the conduction structure further includes the second conduction part, the fourth connection passage and the fourth metal wire form an integrated structure. On this basis, the diffusion barrier layer may be further disposed on a side surface and a bottom surface of the integrated structure including the fourth connection passage and the fourth metal wire, and the bottom surface is close to the substrate. A part of the diffusion barrier layer that is located on a side surface and a bottom surface of the fourth connection passage is located in the fourth via hole.

With reference to the second aspect, in another possible implementation, a dielectric layer disposed between adjacent wiring layers includes at least a first sublayer and a second sublayer, where the second sublayer is an etch barrier layer and is disposed on a side of the first sublayer close to the substrate.

On this basis, optionally, a material of the first sublayer is a material of a low dielectric constant or an ultra-low dielectric constant.

DESCRIPTION OF EMBODIMENTS

The following describes the technical solutions in this application with reference to the accompanying drawings in the embodiments of this application. The described embodiments are merely some but not all of the embodiments of this application.

In addition, in the descriptions of this application, unless otherwise specified, "several" and "a plurality of" mean two or more than two.

Figure 1:
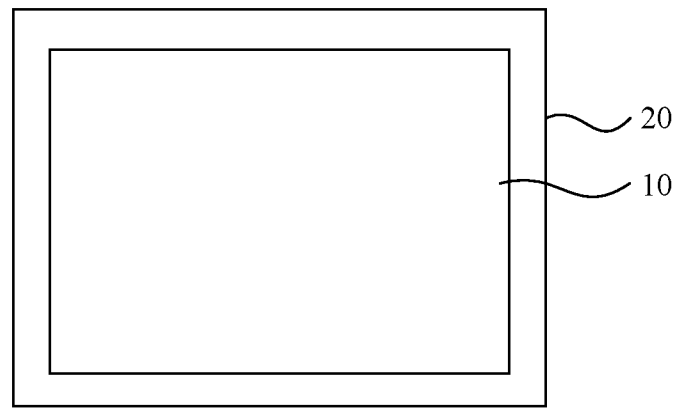
FIG. 1 is a schematic top view of a memory according to this application.
Figure 2:
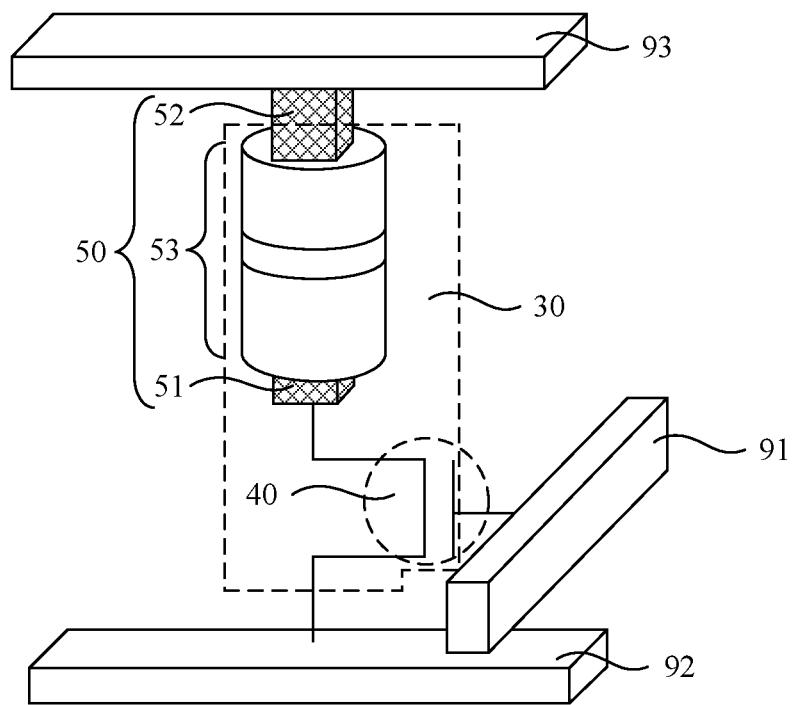
FIG. 2 is a schematic diagram of a connection between a transistor and an MTJ storage element in a storage unit.

This application provides a memory. As shown in FIG. 1, the memory includes a storage area 10, and the storage area 10 includes several storage units disposed on a substrate 20. As shown in FIG. 2, each storage unit 30 includes a transistor 40 disposed on the substrate 20 and an MTJ storage element 50 electrically connected to the transistor 40.

Figure 3:
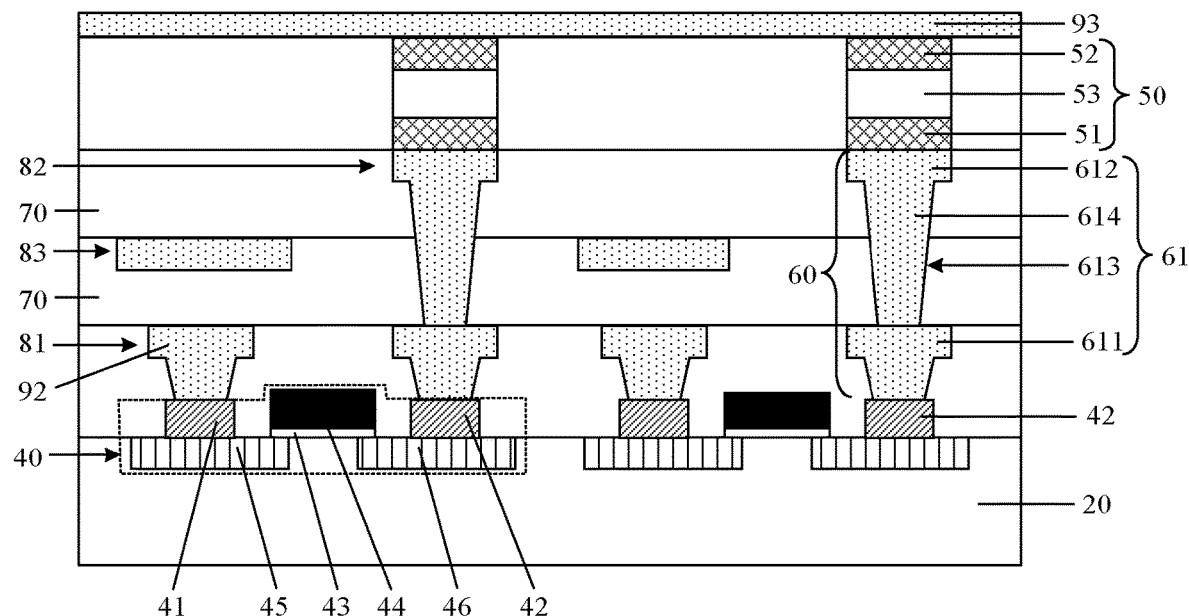
FIG. 3 is a schematic sectional view of a storage unit in a memory according to this application.

As shown in FIG. 3, the MTJ storage element 50 includes a bottom electrode 51, a top electrode 52, and an MTJ 53 located between the bottom electrode 51 and the top electrode 52. The bottom electrode 51 is electrically connected to a drain electrode 42 of the transistor 40 by using a conduction structure 60. A plurality of wiring layers are disposed between the transistor 40 and the MTJ storage element 50 in the storage area 10, and a dielectric layer 70 is filled between adjacent wiring layers.

Still referring to FIG. 3, the conduction structure 60 includes a first conduction part 61, and the first conduction part 61 includes a first metal wire 611, a second metal wire 612, and a first via hole 613 located between the first metal wire 611 and the second metal wire 612. The plurality of wiring layers include a first wiring layer 81, a second wiring layer 82, and a third wiring layer 83, and the third wiring layer 83 is disposed between the first wiring layer 81 and the second wiring layer 82. The first wiring layer 81 includes the first metal wire 611, the second wiring layer 82 includes the second metal wire 612, and the first via hole 613 penetrates the third wiring layer 83 and the dielectric layer 70 that are located between the first wiring layer 81 and the second wiring layer 82. A first connection passage 614 is disposed in the first via hole 613, the first connection passage 614 is directly connected to the first metal wire 611 and the second metal wire 612, and the first connection passage 614 is not directly connected to a metal wire at the third wiring layer 83.

It should be noted that as shown in FIG. 2, a word line 91 and a bit line 93 are further disposed in the storage area 10. The word line 92 is configured to control on or off of the transistor 40, and the bit line 93 is configured to read/write data from or to a corresponding MTJ storage element 50 when the transistor 40 is on. Generally, a gate electrode 44 of a transistor 40 in each storage unit 30 is electrically connected to the word line 91, a source electrode 41 is electrically connected to a source electrode line 92, and the top electrode 52 of the MTJ storage element 50 is electrically connected to the bit line 93.

In addition to the storage unit 30, the memory of this application further includes a peripheral circuit, such as a sense amplification circuit and a read/write circuit. Circuit wiring may be located in a peripheral area of the storage area 10, and wiring of the peripheral circuit (including the word line 91, the source electrode line 92, and the bit line 93) is also disposed in the storage area 10. Circuit wiring of the peripheral circuit is distributed at each wiring layer.

In addition, in this application, all metal wires in the storage area 10, except the transistor 40 and the MTJ storage element 50, on a same plane (the plane is parallel to or substantially parallel to an upper surface of the substrate 20) of the dielectric layer 70 are referred to as one wiring layer. For metal wires that constitute a same wiring layer, there is a distance between different metal wires, and a dielectric material is filled in the distance. The dielectric layer 70 covers the storage area 10.

For the third wiring layer 83, the first via hole 613 penetrates the third wiring layer 83, but the first connection passage 614 disposed in the first via hole 613 is not directly connected to the metal wire at the third wiring layer 83. That is, no metal wire is disposed at a position that is of the third wiring layer 83 and that is corresponding to the first via hole 613, so as to meet this condition. "Direct connection" means direct physical contact without passing through another structure.

Because the first via hole 613 penetrates the third wiring layer 83 and the dielectric layer 70 that are located between the first wiring layer 81 and the second wiring layer 82, and the first connection passage 614 disposed in the first via hole 613 is directly connected to the first metal wire 611 and the second metal wire 612, it may be learned that both ends of the first via hole 613 are directly connected to the first metal wire 611 and the second metal wire 612 respectively.

On the basis of the foregoing, a person skilled in the art should understand that the conduction structure 60 used to connect the bottom electrode 51 of the MTJ storage element and the drain electrode 42 of the transistor is the same in each storage unit 30.

Referring to FIG. 3, in addition to the drain electrode 42, the transistor 40 further includes a source electrode 41, a gate dielectric layer 43, and a gate electrode 44. To distinguish between two electrodes other than the gate electrode 44 of the transistor 40, one electrode of the two electrodes is referred to as the source electrode 41, and the other electrode is referred to as the drain electrode 42. Therefore, the source electrode 41 and the drain electrode 42 in this application are only used to distinguish from each other, which does not indicate that when the transistor 40 is actually connected to a circuit, the drain electrode 42 can be connected to another device in the circuit only as the drain electrode of the transistor 40 in the circuit.

For example, as shown in FIG. 3, the transistor 40 may further include a source electrode region 45 and a drain electrode region 46. The source electrode region 45 is in contact with the source electrode 41, the drain electrode region 46 is in contact with the drain electrode 42, and a region between the source electrode region 45 and the drain electrode region 46 is a passage region. The source electrode region 45 and the drain electrode region 46 may be obtained by performing a doping process on the substrate 20. In this case, the substrate 20 is a semiconductor material, such as silicon.

Optionally, the transistor 40 is configured to control writing, changing, or reading of information in the storage unit 30. That is, the transistor 40 is used as a selector device to control writing, changing, or reading of information in the storage unit 30.

A dielectric material is also filled between the transistor 40 and a wiring layer closest to the transistor 40 (for example, the first wiring layer 81 shown in FIG. 3).

The MTJ storage element 50 is usually integrated in a middle of line process or a back end of line process, and a plurality of wiring layers (the plurality of wiring layers are disposed along a thickness direction of the substrate 20) are disposed between the transistor 40 and the MTJ storage element 50 in the storage area 10.

Figure 4:
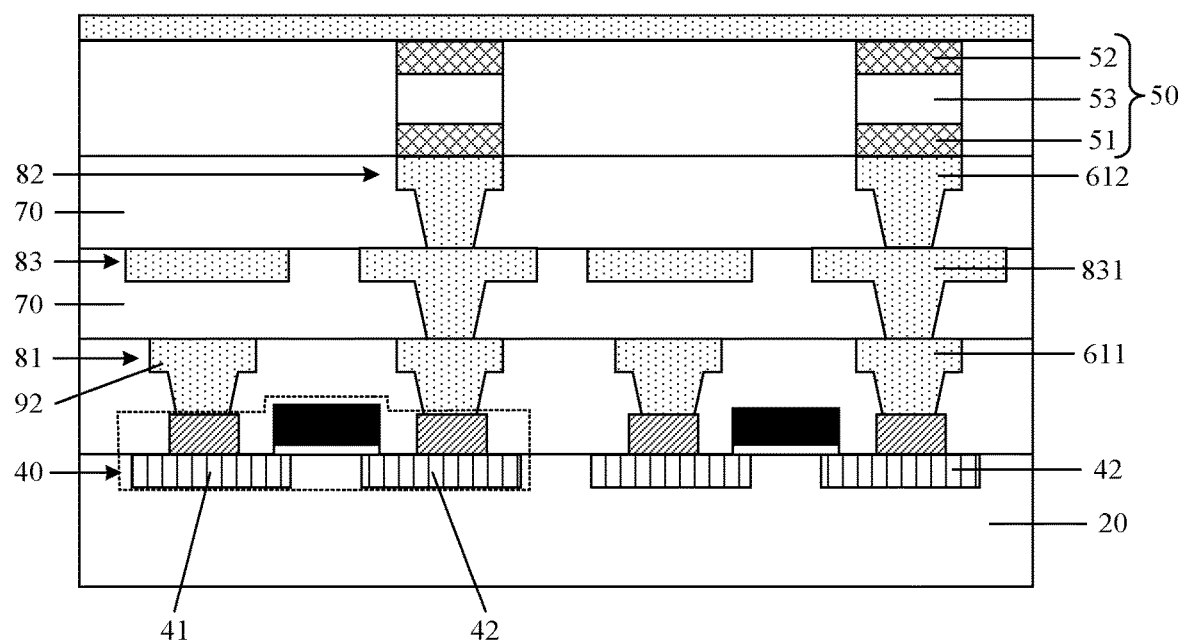
FIG. 4 is a schematic sectional view of a connection between a drain electrode of a transistor and a bottom electrode of an MTJ storage element.

For example, one first wiring layer 81, one second wiring layer 82, and one third wiring layer 83 are disposed between the transistor 40 and the MTJ storage element 50, the first wiring layer 81 is close to the substrate 20, and the third wiring layer 83 is disposed between the first wiring layer 81 and the second wiring layer 82. As shown in FIG. 4, in each storage unit 30, the drain electrode 42 of the transistor 40 may be electrically connected to the bottom electrode 51 of the MTJ storage element 50 in the following manner. The second metal wire 612 at the second wiring layer 82 is directly connected to the bottom electrode of the MTJ storage element 50, in addition, the second metal wire 612 at the second wiring layer 82 is directly connected to a third metal wire 831 at the third wiring layer 83 by using a via hole penetrating the dielectric layer 70 between the second wiring layer 82 and the third wiring layer 83 and a connection passage disposed in the via hole, the third metal wire 831 at the third wiring layer 83 is further directly connected to the first metal wire 611 at the first wiring layer 81 by using a via hole penetrating the dielectric layer 70 between the third wiring layer 83 and the first wiring layer 81 and a connection passage disposed in the via hole, and the first metal wire 611 at the first wiring layer 81 is further directly connected to the drain electrode 42 of the transistor 40 by using a via hole penetrating the dielectric layer 70 between the first wiring layer 81 and the transistor 40 and a connection passage disposed in the via hole, so that the drain electrode 42 of the transistor 40 is electrically connected to the bottom electrode 51 of the MTJ storage element 50.

Figure 5A:
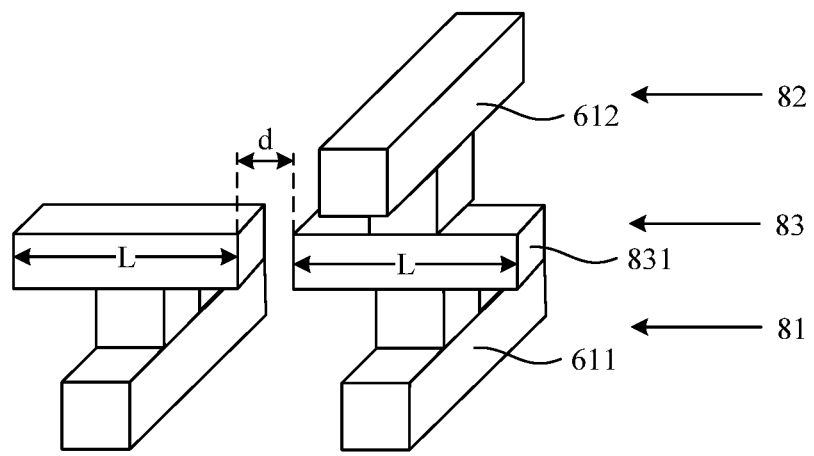
FIG. 5A is a schematic three-dimensional diagram of wiring of a first wiring layer, a second wiring layer, and a third wiring layer in a storage unit in FIG. 4.

With evolution of a semiconductor technology process node, metal interconnects in an integrated circuit gradually change from two-dimensional wiring to strict one-dimensional wiring. Therefore, in FIG. 4, the second metal wire 612, the third metal wire 831, and the first metal wire 611 that are used to electrically connect the drain electrode 42 of the transistor 40 to the bottom electrode 51 of the MTJ storage element 50 may be disposed in a manner shown in FIG. 5A, and a metal wire at each layer is laid out in a one-dimensional manner.

Due to a limitation of a metal wire manufacturing process, a size of a metal wire at a wiring layer needs to meet a requirement of a minimum area (a plane area). The requirement of the minimum area of the metal wire may be converted into a requirement of a minimum length L of the metal wire (shown in FIG. 5A) when a width of the metal wire is a minimum line width. However, there is also a requirement of a minimum distance d between ends of the metal wire (shown in FIG. 5A). Therefore, based on the manner of electrically connecting the drain electrode 42 of the transistor to the bottom electrode 51 of the MTJ storage element in FIG. 4, the requirement of the minimum length of the metal wire and the requirement of the minimum distance between ends of adjacent metal wires at a same wiring layer limit integration of the memory.

Figure 6:
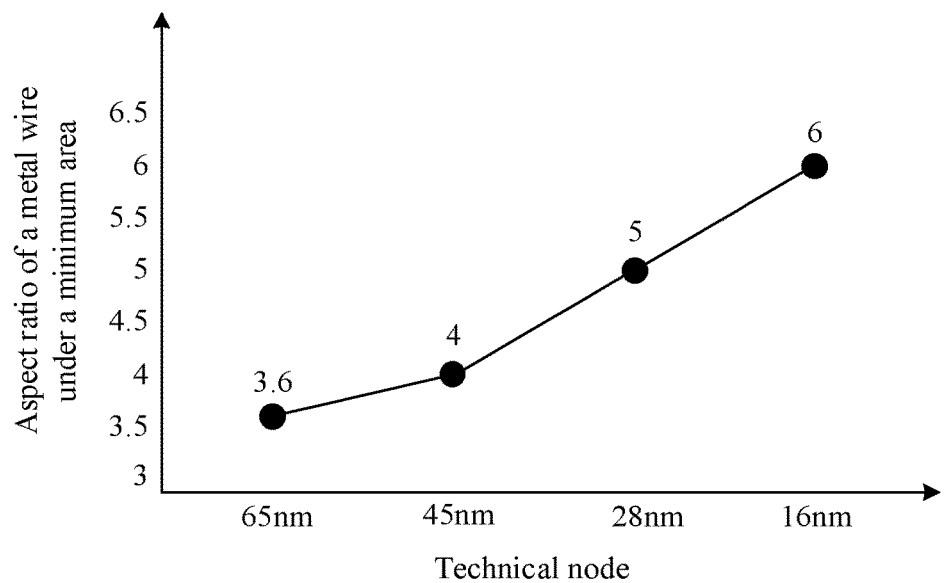
FIG. 6 is a change trend of a minimum length of a metal wire with a technology node.

The requirement of the minimum area of the metal wire continues to deteriorate with the development of a technology node. As can be seen from FIG. 6 that, from a 65 nm node to a 16 nm node, to meet the requirement of the minimum area, the requirement of the minimum length of the metal wire has increased from 3.6 times a minimum metal line width to 6 times. That is, with the development of the technology node, the minimum length of the metal wire gradually increases. Therefore, the requirement of the minimum length of the metal wire gradually becomes a bottleneck that prevents memory integration density from being further improved.

Figure 5B:
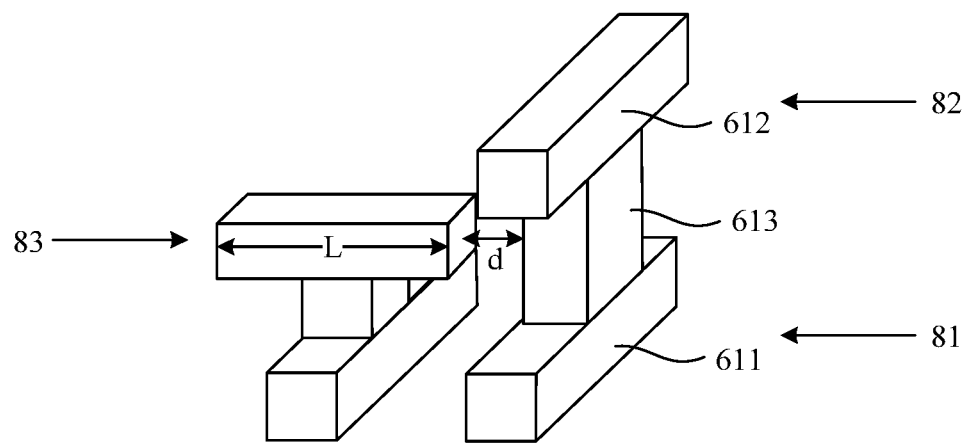
FIG. 5B is a schematic three-dimensional diagram of wiring of a first wiring layer, a second wiring layer, and a third wiring layer in a storage unit in FIG. 2.

In this application, referring to FIG. 5B, the first via hole 613 penetrates the third wiring layer 83, that is, no metal wire is disposed at a position that is of the third wiring layer 83 and that is corresponding to the first via hole 613. Therefore, by comparing FIG. 5A with FIG. 5B, because the first via hole 613 is disposed in FIG. 5B, the third metal wire 831 in FIG. 5A, located between the first metal wire 611 and the second metal wire 612 and disposed at the third wiring layer 83 may be omitted. The third metal wire 831 located between the first metal wire 611 and the second metal wire 612 and disposed at the third wiring layer 83 is omitted, so that corresponding space occupied due to the requirement of the minimum length of the metal wire can be released.

In the memory provided in this application, in the conduction structure 60 configured to electrically connect the drain electrode 42 of the transistor 40 to the bottom electrode 51 of the MTJ storage element 50, the first via hole 613 of the first conduction part 61 penetrates the third wiring layer 83 located between the first wiring layer 81 and the second wiring layer 82, and the first connection passage 614 disposed in the first via hole 613 is directly connected to the first metal wire 611 and the second metal wire 612. Therefore, compared with FIG. 4 that the first metal wire 611 and the second metal wire 612 are electrically connected by using the third metal wire 831 located between the first metal wire 611 and the second metal wire 612 and disposed at the third wiring layer 83, the third metal wire 831 is omitted in this application. Therefore, space occupied by the third metal wire 831 can be released. On this basis, in one aspect, the space released from the third metal wire 831 may be used for circuit wiring, so as to ease overall circuit wiring congestion. In another aspect, after the third metal wire 831 is omitted, when the minimum distance of wiring is met, an area occupied by each storage unit 30 can be reduced, and therefore, integration density of the memory can be improved. In still another aspect, resistance of the via hole mainly comes from an interface between the via hole and a metal wire in contact with a lower part (close to the substrate 20) of the via hole. In this application, because the first via hole 613 crosses the third wiring layer 83, no interface exists between the first via hole 613 and the metal wire at the third wiring layer 83, lower resistance is caused, and a parasitic capacitance can be reduced, thereby improving overall performance of the memory.

Optionally, in this application, the first metal wire 611 and the second metal wire 612 are parallel in a length direction. On this basis, in a width direction of the first metal wire 611 and the second metal wire 612, a size of the storage unit 30 is reduced, thereby further improving integration density of the memory.

Figure 7:
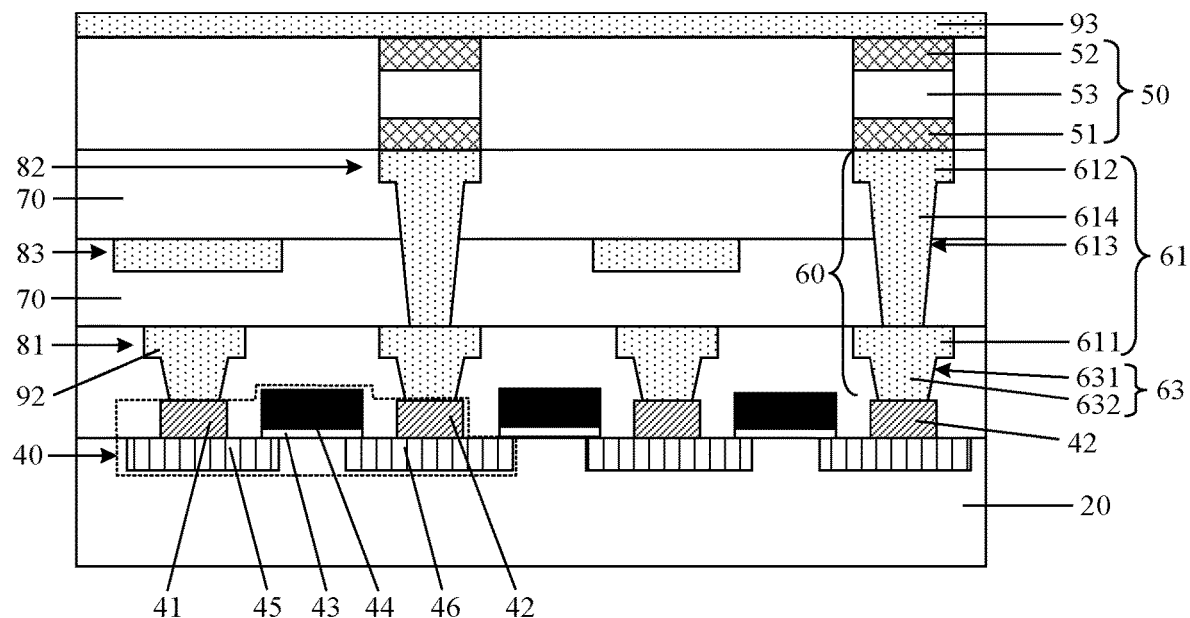
FIG. 7 is a schematic sectional view of a storage unit in another memory according to this application.

Optionally, when the source electrode 41 and the drain electrode 42 of the transistor 40 are symmetrical, the source electrode 41 and the drain electrode 42 are not different. Therefore, as shown in FIG. 7, transistors 40 in two adjacent storage units 30 may share a drain electrode 42. Therefore, integration density of the memory can be further improved.

Figure 8:
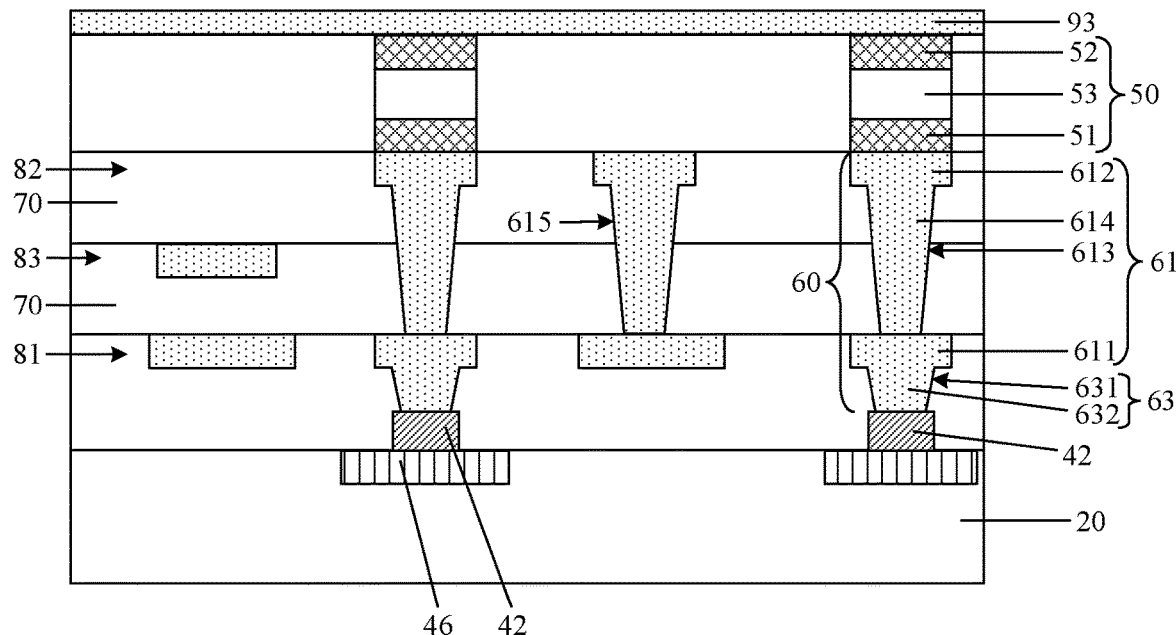
FIG. 8 is a schematic sectional view of a storage unit in another memory according to this application.

Optionally, as shown in FIG. 8, a second via hole 615 is disposed in the storage area 10, and the second via hole 615 penetrates the third wiring layer 83. The first via hole 613 is adjacent to the second via hole 615, and no metal wire exists on a part that is of the third wiring layer 83 and that is located between the first via hole 613 and the second via hole 615.

Herein, the first via hole 613 is adjacent to the second via hole 615, that is, no other via hole exists between the first via hole 613 and the second via hole 615. A function of the second via hole 615 is not limited, and the second via hole 615 may be used to connect circuit wiring at different wiring layers.

It should be noted that, compared with a cross-sectional view shown in FIG. 7, a cross-sectional view shown in FIG. 8 is a cross-sectional view taken in another direction of the storage area 10. A connection between the second via hole 615 and the metal wire at the second wiring layer 82 and the first wiring layer 81 in FIG. 8 is only an example.

When no metal wire is disposed at positions of the third wiring layer 83 that are corresponding to the first via hole 613 and the second via hole 615, and the metal wire of the third wiring layer 83 does not exist between the first via hole 613 and the second via hole 615, the first via hole 613 and the second via hole 615 need to meet only a requirement of a via hole distance during disposing. Therefore, integration density of the memory can be higher.

Figure 9:
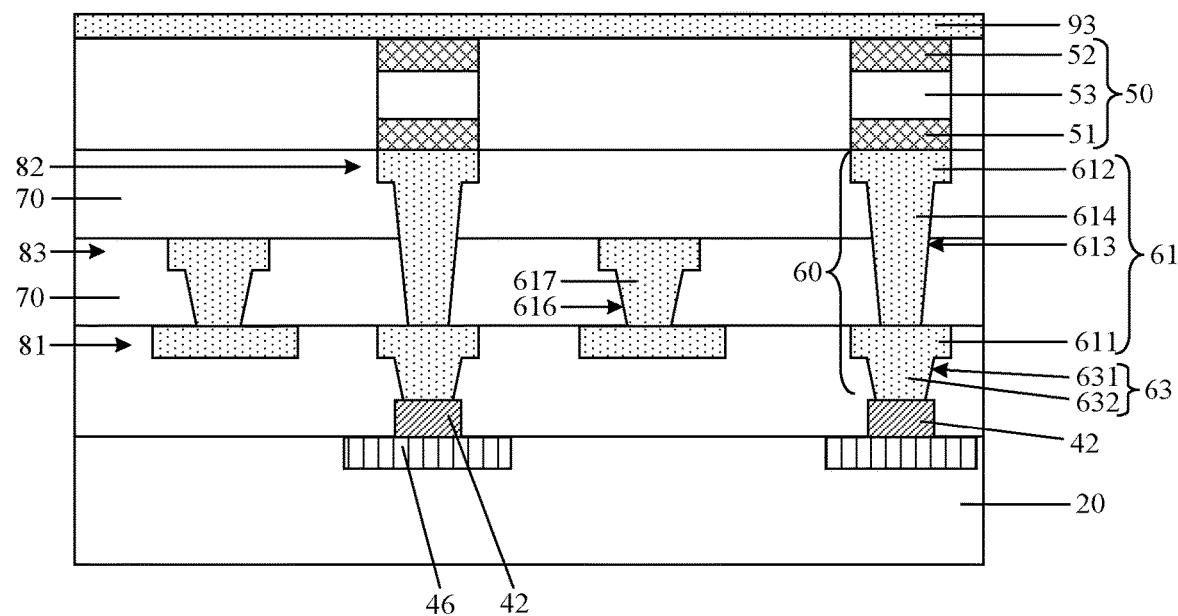
FIG. 9 is a schematic sectional view of a storage unit in another memory according to this application.

Optionally, as shown in FIG. 9, a third via hole 616 is disposed in the storage area 10, one end of the third via hole 616 starts from the third wiring layer 83, a third connection passage 617 in the third via hole 616 is connected to the metal wire at the third wiring layer 83, and the third via hole 616 is adjacent to the first via hole 613.

Herein, the third via hole 616 is adjacent to the first via hole 613, that is, no other via hole exists between the third via hole 616 and the first via hole 613. A function of the third via hole 616 is not limited, and the third via hole 616 may be used to connect circuit wiring at different wiring layers.

It should be noted that, compared with the cross-sectional view shown in FIG. 7, a cross-sectional view shown in FIG. 9 is a cross-sectional view taken in another direction of the storage area 10. A connection between the third via hole 616 and the metal wire at the first wiring layer 81 in FIG. 9 is only an example.

Compared with the technical solution in FIG. 4, the third metal wire 831 is omitted in the solution of this application. Therefore, corresponding released space may be used for circuit wiring.

Figure 10:
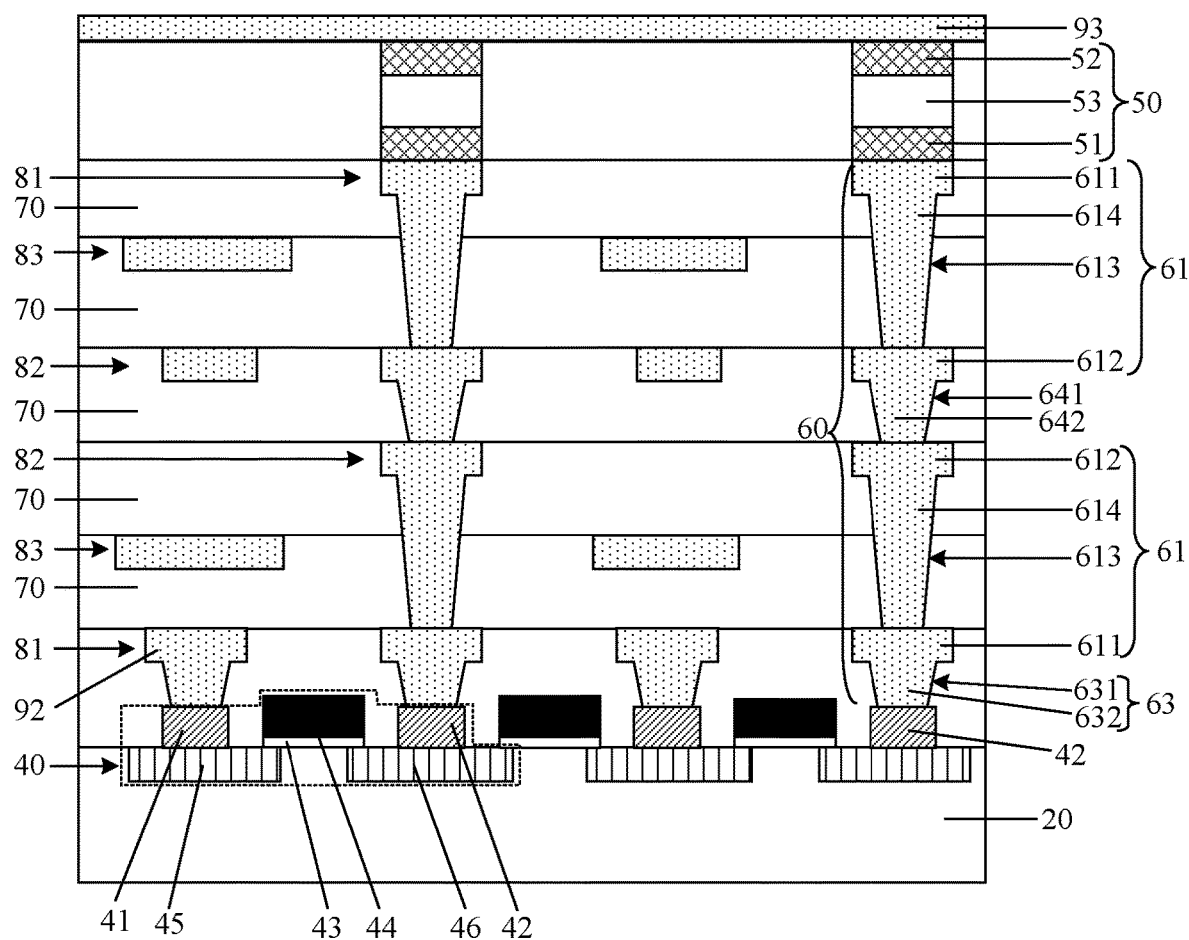
FIG. 10 is a schematic sectional view of a storage unit in another memory according to this application.
Figure 11:
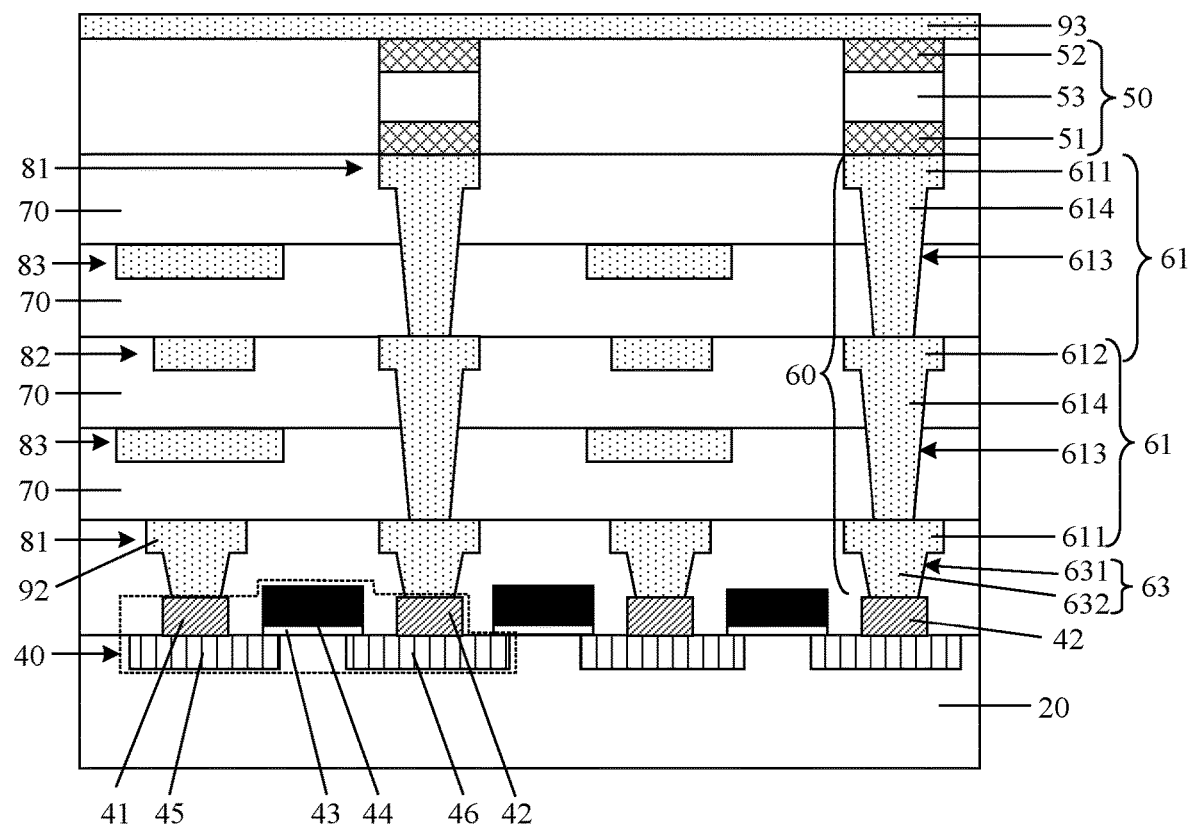
FIG. 11 is a schematic sectional view of a storage unit in another memory according to this application.

Optionally, as shown in FIG. 10 and FIG. 11, there are at least two first conduction parts 61, and all the first conduction parts 61 are disposed in the thickness direction of the substrate 20.

It should be noted that, two adjacent first conduction parts 61 may be connected by using a sixth via hole 641 and a sixth connection passage 642 located in the sixth via hole 641 as shown in FIG. 10, or may be directly connected as shown in FIG. 11.

Based on different positions of the MTJ storage element 50, in particular, when the MTJ storage element 50 is integrated in the back end of line process, at least two first conduction parts 61 may be disposed in the conduction structure 60, so as to improve integration density of the memory.

Further, optionally, as shown in FIG. 11, any two adjacent first conduction parts 61 share the second metal wire 612 or the first metal wire 611.

In FIG. 11, two first conduction parts 61 are used as an example. In this example, if a plurality of wiring layers disposed between the transistor 40 and the MTJ storage element 50 in the storage area 10 are successively a first wiring layer 81, a third wiring layer 83, a second wiring layer 82, a third wiring layer 83, and a first wiring layer 81 starting from the one closest to the substrate 20, the two first conduction parts 61 share the second metal wire 612.

It may be understood that if the plurality of wiring layers disposed between the transistor 40 and the MTJ storage element 50 in the storage area 10 are successively a second wiring layer 82, a third wiring layer 83, a first wiring layer 81, a third wiring layer 83, and a second wiring layer 82 starting from the one closest to the substrate 20, the two first conduction parts 61 share the first metal wire 611.

When there are three first conduction parts 61, and the first conduction part 61 located in the middle is separately adjacent to the first conduction parts 61 on its both sides in a direction perpendicular to the substrate 20, the first conduction part 61 located in the middle shares the second metal wire 612 with the first conduction part 61 on one side, and the first conduction part 61 located in the middle shares the first metal wire 611 with the first conduction part 61 on the other side.

Figure 12:
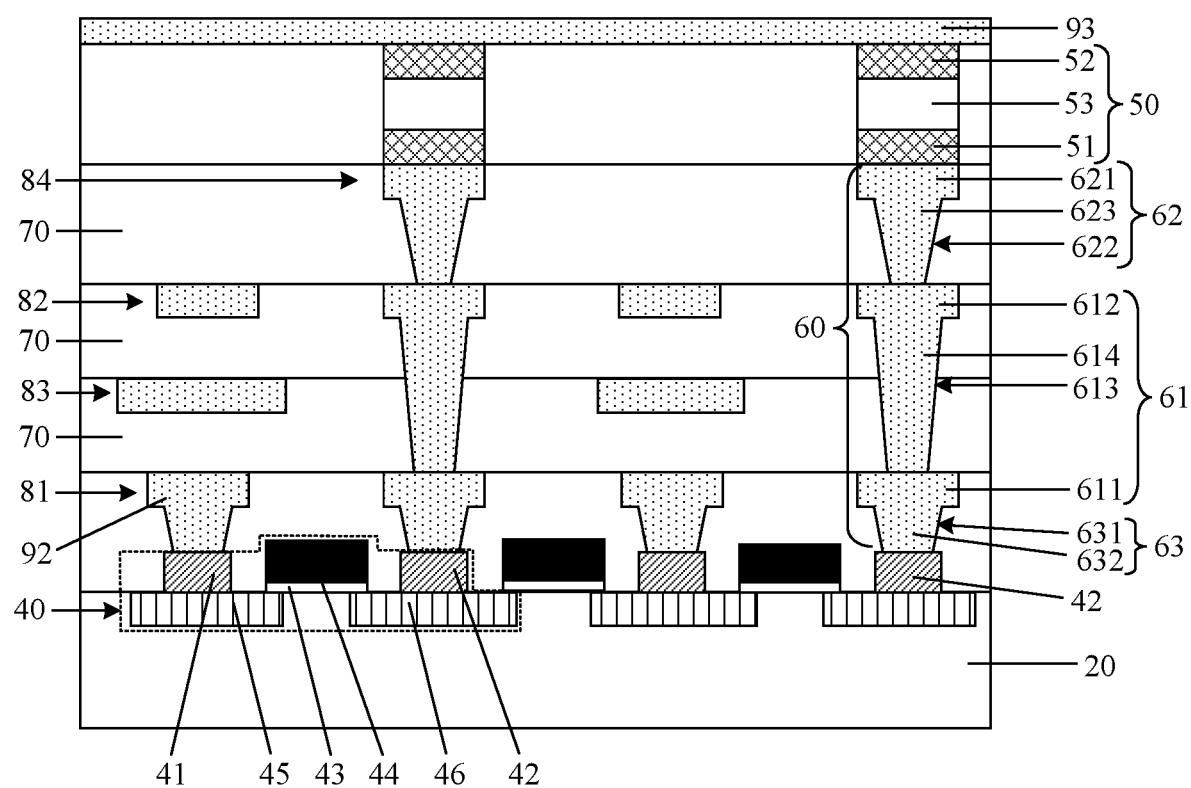
FIG. 12 is a schematic sectional view of a storage unit in another memory according to this application.

Optionally, as shown in FIG. 12, the conduction structure 60 further includes a second conduction part 62, and the second conduction part 62 is disposed between the first conduction part 61 and the MTJ storage element 50. The second conduction part 62 includes a fourth metal wire 621 and a fourth via hole 622. The plurality of wiring layers further include a fourth wiring layer 84, and the fourth wiring layer 84 includes the fourth metal wire 621. The fourth via hole 622 penetrates a dielectric layer 70 between the fourth wiring layer 84 and the first conduction part 61. A fourth connection passage 623 is disposed in the fourth via hole 622, and the fourth connection passage 623 is directly connected to the fourth metal wire 621 and the first metal wire 611 or the second metal wire 612 adjacent to the fourth metal wire 621.

A length direction of the fourth metal wire 621 may be parallel to length directions of the first metal wire 611 and the second metal wire 612.

FIG. 12 is a schematic diagram by using an example in which the fourth wiring layer 84 is disposed adjacent to the second wiring layer 82. In this case, the fourth connection passage 623 is directly connected to the fourth metal wire 621 and the second metal wire 612. The fourth wiring layer 84 is adjacent to the second wiring layer 82, that is, no other wiring layer exists between the fourth wiring layer 84 and the second wiring layer 82.

If the fourth wiring layer 84 is disposed adjacent to the first wiring layer 81, the fourth connection passage 623 is directly connected to the fourth metal wire 621 and the first metal wire 611. The fourth wiring layer 84 is adjacent to the first wiring layer 81, that is, no other wiring layer exists between the fourth wiring layer 84 and the first wiring layer 81.

It should be noted that, regardless of a quantity of first conduction parts 61, all first conduction parts 61 should be considered as a whole, and the second conduction part 62 is disposed between the first conduction part 61 and the MTJ storage element 50. That is, when there are a plurality of first conduction parts 61, the second conduction part 62 is disposed between a first conduction part 61 closest to the MTJ storage element 50 and the MTJ storage element 50.

In addition, in the accompanying drawings related to this application, arrowed lines next to "81", "82", "83", and "84" are used to indicate one wiring layer.

Optionally, referring to FIG. 10 to FIG. 12, the conduction structure 60 further includes a third conduction part 63, and the third conduction part 63 is disposed between the first conduction part 61 and the transistor 40. The third conduction part 63 includes a fifth via hole 631, and the fifth via hole 631 penetrates the dielectric layer 70 between the first conduction part 61 and the drain electrode 42 of the transistor. A fifth connection passage 632 is disposed in the fifth via hole 631, and the fifth connection passage 632 is directly connected to the drain electrode 42 of the transistor 40 and the first metal wire 611 or the second metal wire 612 adjacent to the drain electrode 42 of the transistor 40.

FIG. 10 to FIG. 12 are schematic diagrams by using an example in which the first wiring layer 81 is closer to the transistor 40. In this case, the fifth connection passage 632 is directly connected to the drain electrode 42 of the transistor 40 and the first metal wire 611.

If the second wiring layer 82 is closer to the transistor 40, the fifth connection passage 632 is directly connected to the drain electrode 42 of the transistor 40 and the second metal wire 612.

It should be noted that, regardless of a quantity of first conduction parts 61, all first conduction parts 61 should be considered as a whole, and the third conduction part 63 is disposed between the first conduction part 61 and the transistor 40. That is, when there are a plurality of first conduction parts 61, the third conduction part 63 is disposed between the first conduction part 61 closest to the substrate 20 and the transistor 40.

Optionally, the first via hole 613 penetrates one or two third wiring layers 83 between the first wiring layer 81 and the second wiring layer 82.

When there are at least two first conduction parts 61 of the conduction structure 60, a first via hole 613 of each first conduction part 61 penetrates one or two third wiring layers 83.

Figure 13:
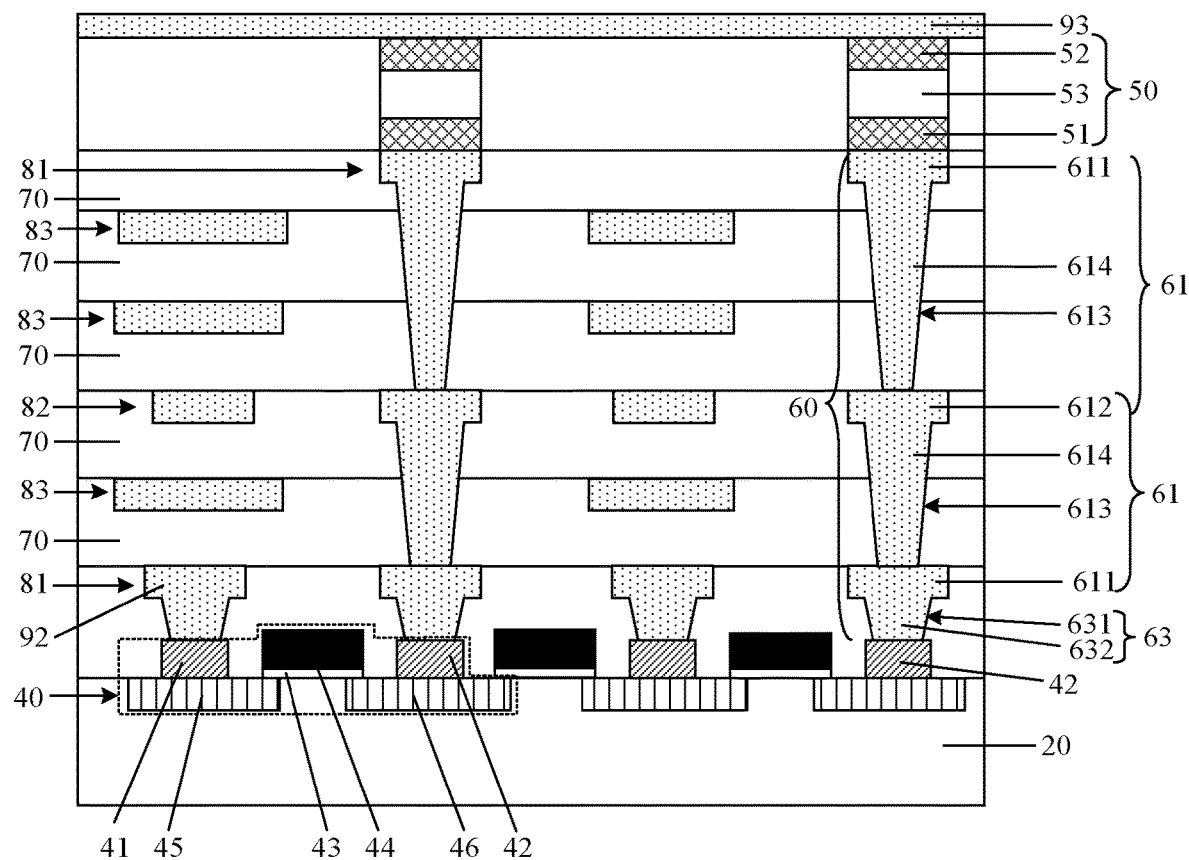
FIG. 13 is a schematic sectional view of a storage unit in another memory according to this application.

That is, for example, when the conduction structure 60 includes two first conduction parts 61, a first via hole 613 of one first conduction part 61 may penetrate one third wiring layer 83, and a first via hole 613 of the other first conduction part 61 may penetrate two third wiring layers 83 (shown in FIG. 13), or first via holes 613 of both the two first conduction parts 61 penetrate one third wiring layer 83 (shown in FIG. 11), or first via holes 613 of both the two first conduction parts 61 penetrate two third wiring layers 83.

Figure 14:
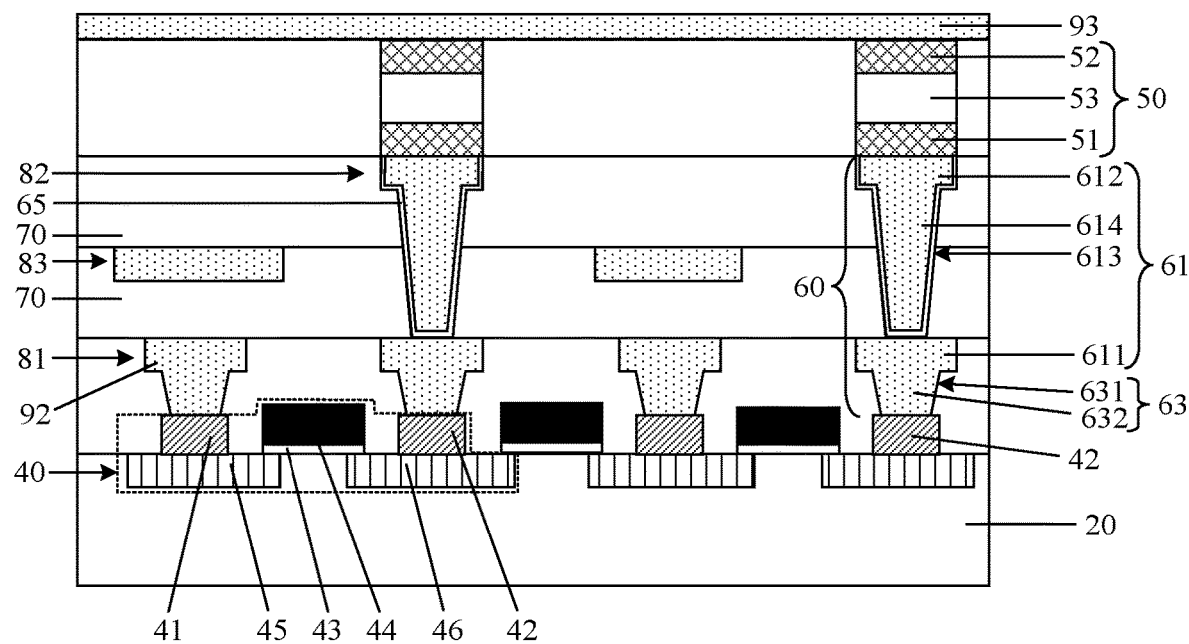
FIG. 14 is a schematic sectional view of a storage unit in another memory according to this application.
Figure 15:
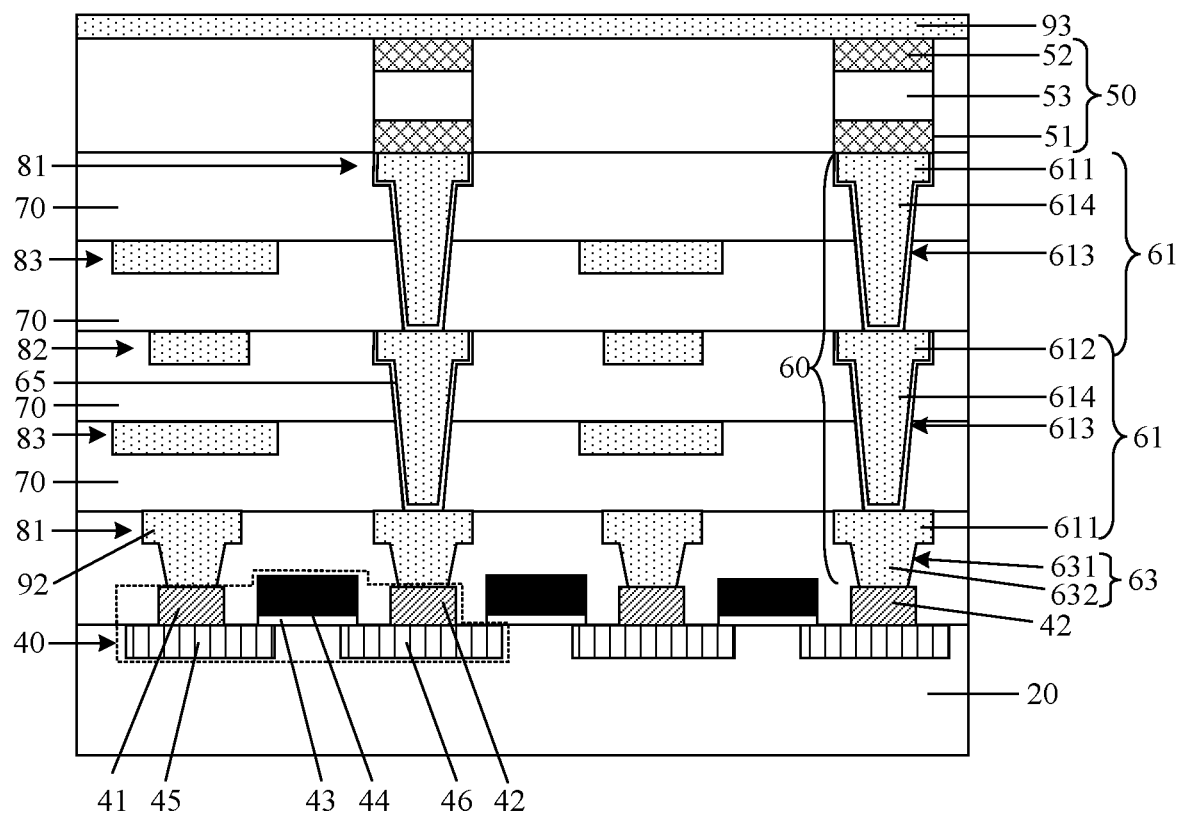
FIG. 15 is a schematic sectional view of a storage unit in another memory according to this application.
Figure 16:
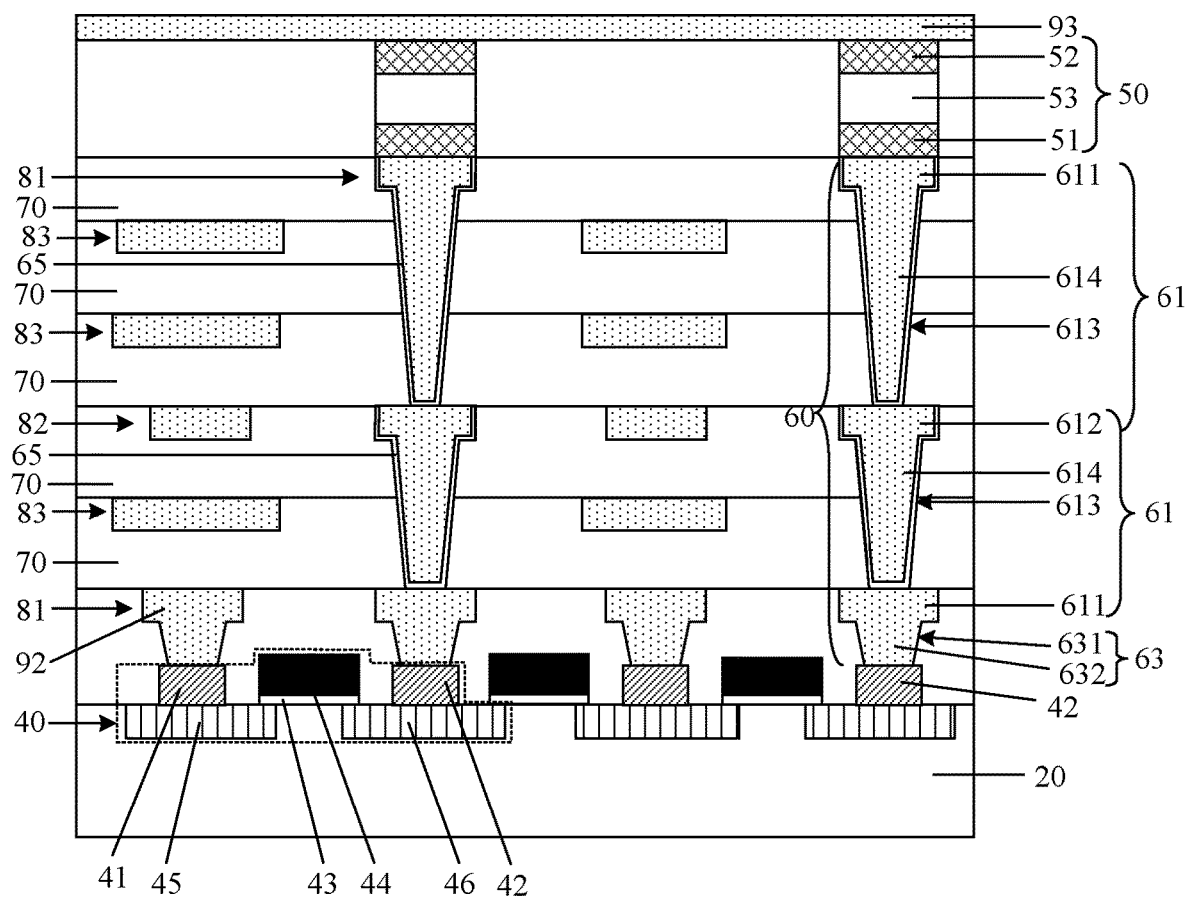
FIG. 16 is a schematic sectional view of a storage unit in another memory according to this application.

Optionally, as shown in FIG. 14 to FIG. 16, in each first conduction part 61, a first connection passage 614 and a first metal wire 611 or a second metal wire 612 that is located on a side of the first connection passage 614 away from the substrate 20 and that is directly connected to the first connection passage 614 form an integrated structure. On this basis, a diffusion barrier layer 65 is disposed on a side surface and a bottom surface of the integrated structure, and the bottom surface is close to the substrate 20. A part of the diffusion barrier layer 65 that is located on a side surface and a bottom surface of the first connection passage 614 is located in the first via hole 613.

FIG. 14 is a schematic diagram by using an example in which one first conduction part 61 is disposed. In the first conduction part 61, the second metal wire 612 is located on a side of the first connection passage 614 away from the substrate 20. Therefore, the first connection passage 614 and the second metal wire 612 directly connected to the first connection passage 614 form an integrated structure. On this basis, the diffusion barrier layer 65 is disposed on a side surface and a bottom surface of the first connection passage 614 and the second metal wire 612 of the integrated structure, and a part of the diffusion barrier layer 65 that is located on the side surface and the bottom surface of the first connection passage 614 is located in the first via hole 613.

FIG. 15 and FIG. 16 are schematic diagrams by using an example in which two first conduction parts 61 are disposed. For a first conduction part 61 closer to the substrate 20, because the second metal wire 612 is located on a side of the first connection passage 614 away from the substrate 20, in the first conduction part 61, the first connection passage 614 and the second metal wire 612 directly connected to the first connection passage 614 form an integrated structure. The diffusion barrier layer 65 is disposed on a side surface and a bottom surface of the first connection passage 614 and the second metal wire 612 of the integrated structure, and a part of the diffusion barrier layer 65 that is located on the side surface and the bottom surface of the first connection passage 614 is located in the first via hole 613. For the other first conduction part 61, because the first metal wire 611 is located on a side of the first connection passage 614 away from the substrate 20, in the first conduction part 61, the first connection passage 614 and the first metal wire 611 directly connected to the first connection passage 614 form an integrated structure. The diffusion barrier layer 65 is disposed on a side surface and a bottom surface of the first connection passage 614 and the first metal wire 611 of the integrated structure, and a part of the diffusion barrier layer 65 that is located on the side surface and the bottom surface of the first connection passage 614 is located in the first via hole 613.

The "integrated structure" means that two parts of materials constituting the integrated structure are the same and are simultaneously formed. Specifically, when the first connection passage 614 and the first metal wire 611 that is located on the side of the first connection passage 614 away from the substrate 20 and that is directly connected to the first connection passage 614 form an integrated structure, the first connection passage 614 and the first metal wire 611 that is located on the side of the first connection passage 614 away from the substrate 20 and that is directly connected to the first connection passage 614 are simultaneously formed. When the first connection passage 614 and the second metal wire 612 that is located on the side of the first connection passage 614 away from the substrate 20 and that is directly connected to the first connection passage 614 form an integrated structure, the first connection passage 614 and the second metal wire 612 that is located on the side of the first connection passage 614 away from the substrate 20 and that is directly connected to the first connection passage 614 are simultaneously formed.

Because some interconnect metal materials, such as copper (Cu), are easy to diffuse, resulting in circuit performance degradation or failure, the diffusion barrier layer 65 needs to be disposed to prevent diffusion. For different interconnect metal materials, different materials of the diffusion barrier layer 65 need to be used correspondingly, so as to ensure a barrier function of the diffusion barrier layer 65, adhesion to the integrated structure and the dielectric layer 70, and the like.

For example, when a material of the integrated structure is Cu, a tantalum nitride (TaN)/tantalum (Ta) double-layer structure may be used as the diffusion barrier layer 65, or a TaN/cobalt (Co) double-layer structure may be used as the diffusion barrier layer 65.

It should be noted that the interconnect metal material applied to the memory in this application may further be Co, ruthenium (Ru), tungsten (W), or the like, and whether to dispose the diffusion barrier layer 65 may be determined based on diffusivity of these materials.

Figure 17:
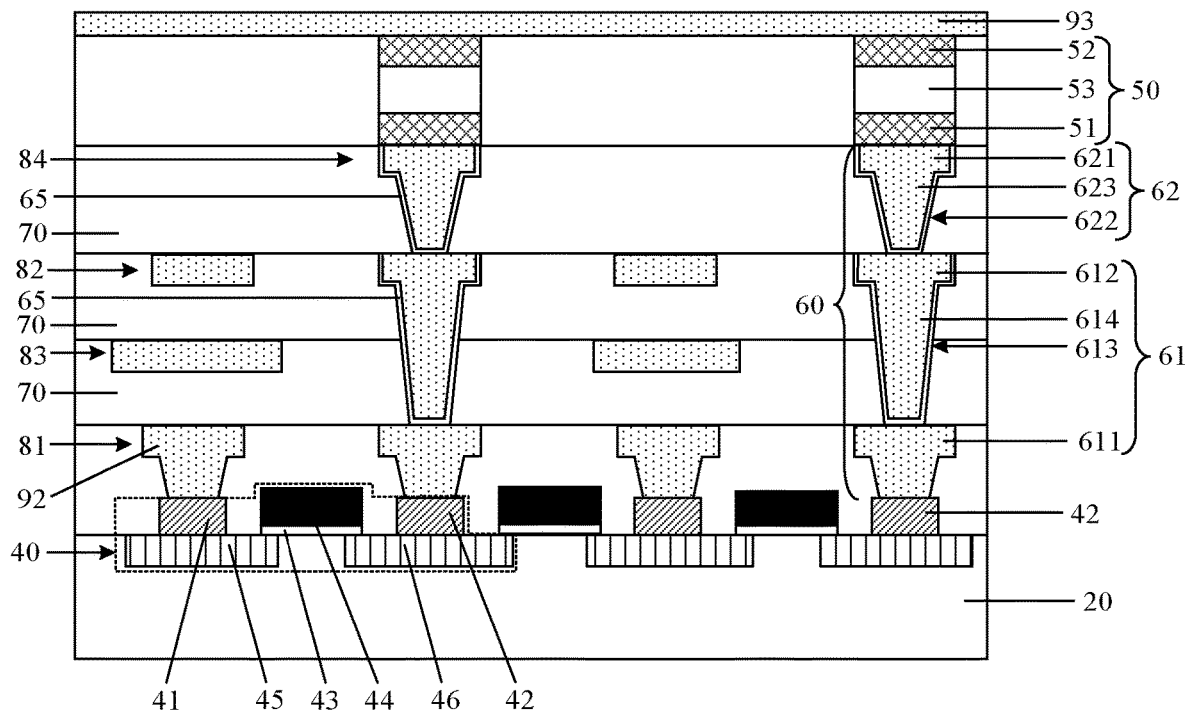
FIG. 17 is a schematic sectional view of a storage unit in another memory according to this application.

Further, optionally, when the conduction structure 60 further includes the second conduction part 62, as shown in FIG. 17, the fourth connection passage 623 and the fourth metal wire 621 form an integrated structure. On this basis, the diffusion barrier layer 65 may be further disposed on a side surface and a bottom surface of the integrated structure including the fourth connection passage 623 and the fourth metal wire 621, and the bottom surface is close to the substrate 20. A part of the diffusion barrier layer 65 that is located on a side surface and a bottom surface of the fourth connection passage 623 is located in the fourth via hole 622.

Figure 18:
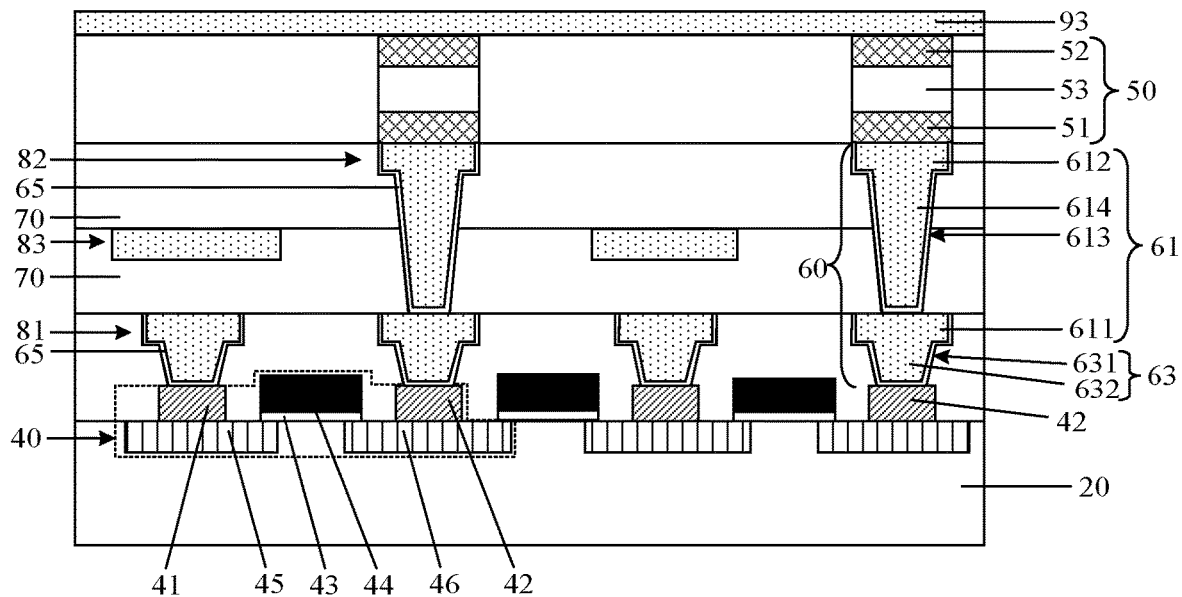
FIG. 18 is a schematic sectional view of a storage unit in another memory according to this application.

Optionally, when the conduction structure 60 further includes the third conduction part 63, as shown in FIG. 18, the fifth connection passage 632 and the first metal wire 611 or the second metal wire 612 that is located on a side of the fifth connection passage 632 away from the substrate 20 and that is directly connected to the fifth connection passage 632 form an integrated structure. The diffusion barrier layer 65 may be further disposed on a side surface and a bottom surface of the integrated structure including the fifth connection passage 632 and one of the first metal wire 611 and the second metal wire 612, and the bottom surface is close to the substrate 20. A part of the diffusion barrier layer 65 that is located on a side surface and a bottom surface of the fifth connection passage 632 is located in the fifth via hole 631.

FIG. 18 is a schematic diagram by using an example in which a fifth connection passage 632 and a first metal wire 611 form an integrated structure.

Figure 19:
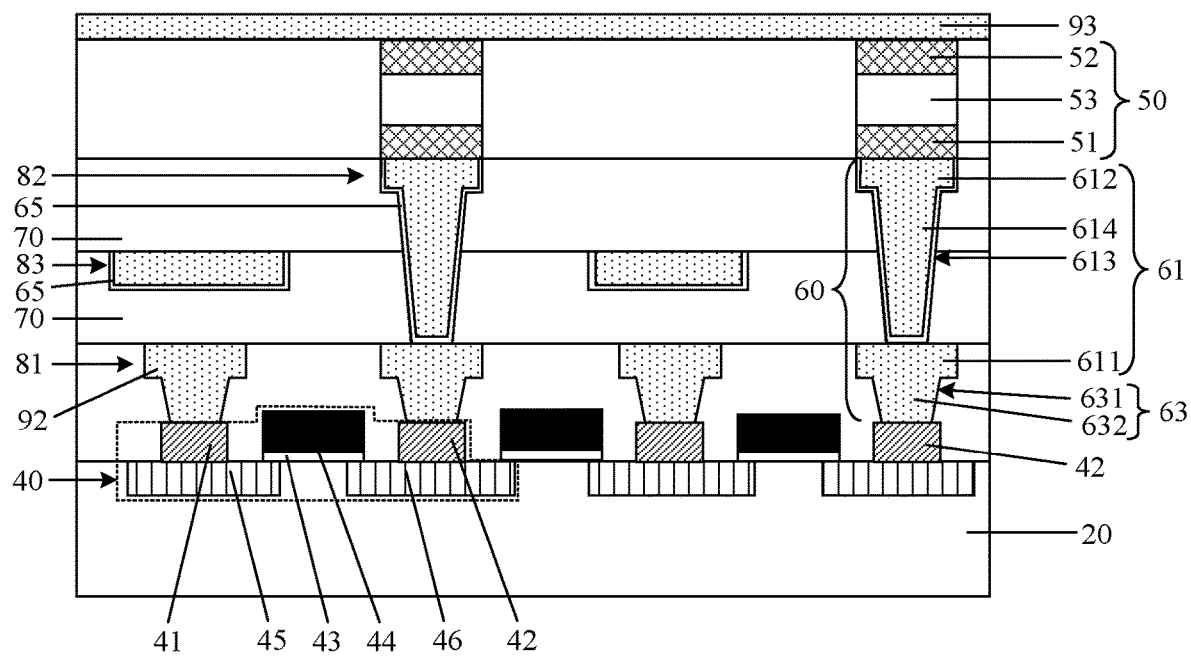
FIG. 19 is a schematic sectional view of a storage unit in another memory according to this application.

It should be noted that the foregoing describes only cases in which the diffusion barrier layer 65 is disposed at a position of the conduction structure 60. For circuit wiring and related via holes, a corresponding diffusion barrier layer 65 may also be disposed based on a used interconnect metal material. Details are not described in this application. FIG. 14 is used as an example. It may be seen from the cross-sectional view that the third wiring layer 83 has circuit wiring. Therefore, as shown in FIG. 19, the diffusion barrier layer 65 may also be disposed on a side surface and a bottom surface of circuit wiring of the third wiring layer 83.

Figure 20:
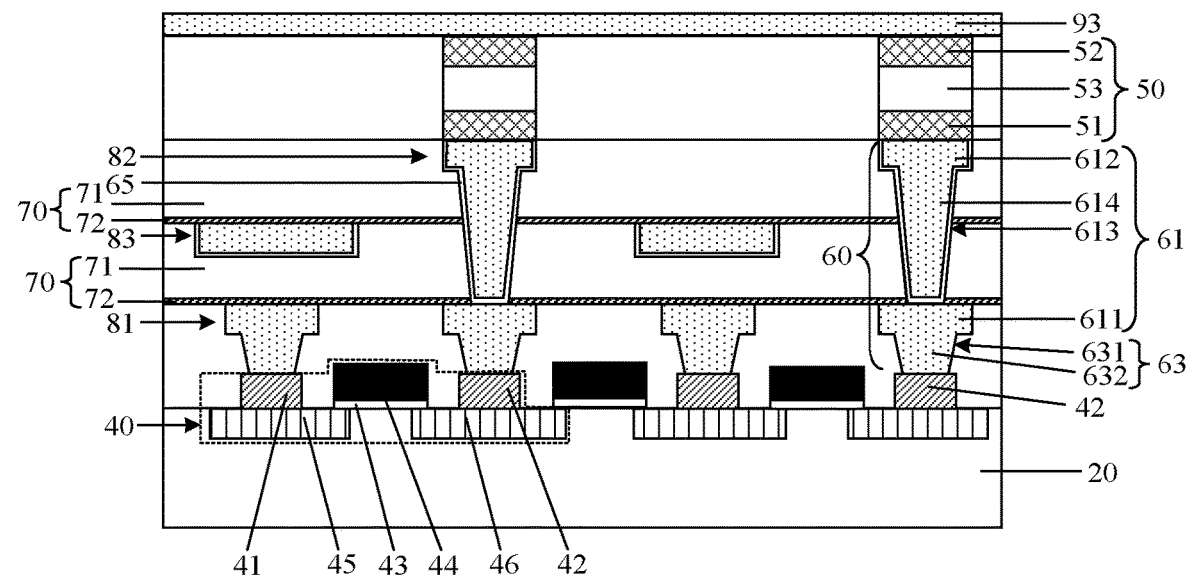
FIG. 20 is a schematic sectional view of a storage unit in another memory according to this application.
Figure 21:
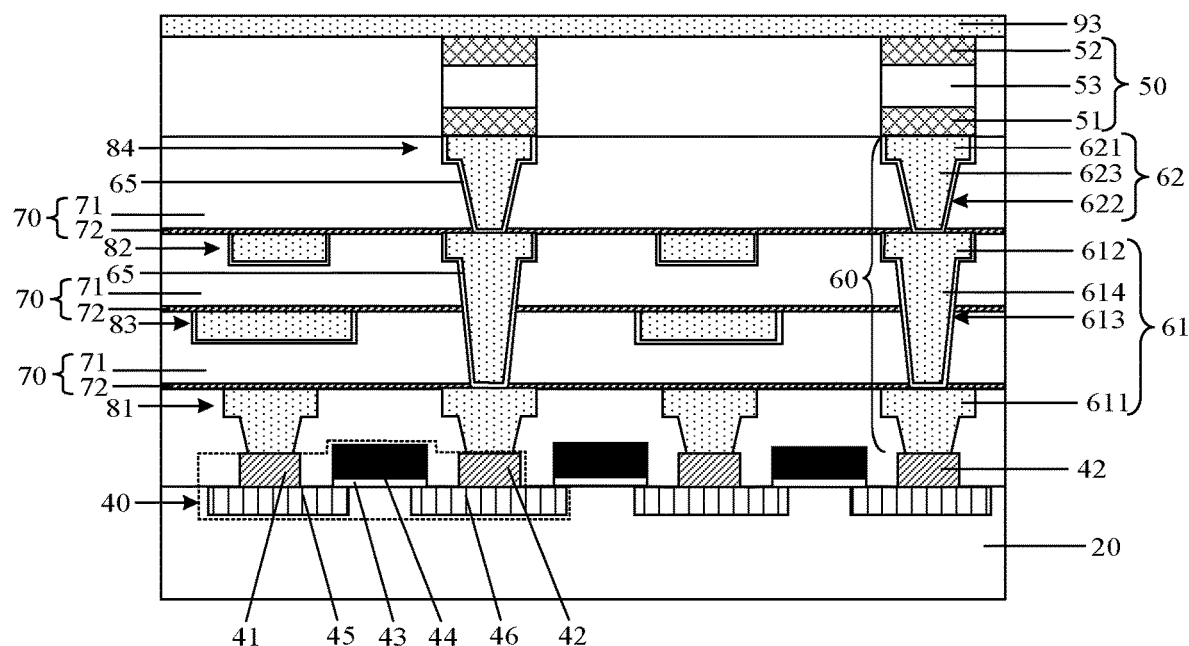
FIG. 21 is a schematic sectional view of a storage unit in another memory according to this application.

Optionally, as shown in FIG. 20 and FIG. 21, a dielectric layer 70 disposed between adjacent wiring layers includes at least a first sublayer 71 and a second sublayer 72, where the second sublayer 72 is an etch barrier layer and is disposed on a side of the first sublayer 71 close to the substrate 20.

The second sublayer 72 is disposed on the side of the first sublayer 71 close to the substrate 20, that is, the second sublayer 72 is formed, and then the first sublayer 71 is formed.

The dielectric layer 70 includes the first sublayer 71 and the second sublayer 72, where the second sublayer 72 is an etch barrier layer and is disposed on the side of the first sublayer 71 close to the substrate 20, thereby avoiding impact on a wiring layer formed when a wiring layer above (that is, a side away from the substrate 20) the dielectric layer 70 is formed.

Further, optionally, a material of the first sublayer 71 is a material of a low dielectric constant or an ultra-low dielectric constant.

It should be noted that a dielectric of a low dielectric constant or an ultra-low dielectric constant is a dielectric material whose dielectric constant value is less than a dielectric constant (the dielectric constant is 3.9 to 4) of silicon dioxide.

When the material of the first sublayer 71 is the material of a low dielectric constant or an ultra-low dielectric constant, a parasitic capacitance between adjacent wiring layers can be reduced.

This application further provides a memory. As shown in FIG. 1, the memory includes a storage area 10, and the storage area 10 includes several storage units 30 disposed on a substrate 20. As shown in FIG. 2, each storage unit 30 includes a transistor 40 disposed on the substrate 20 and an MTJ storage element 50 electrically connected to the transistor 40.

Figure 22:
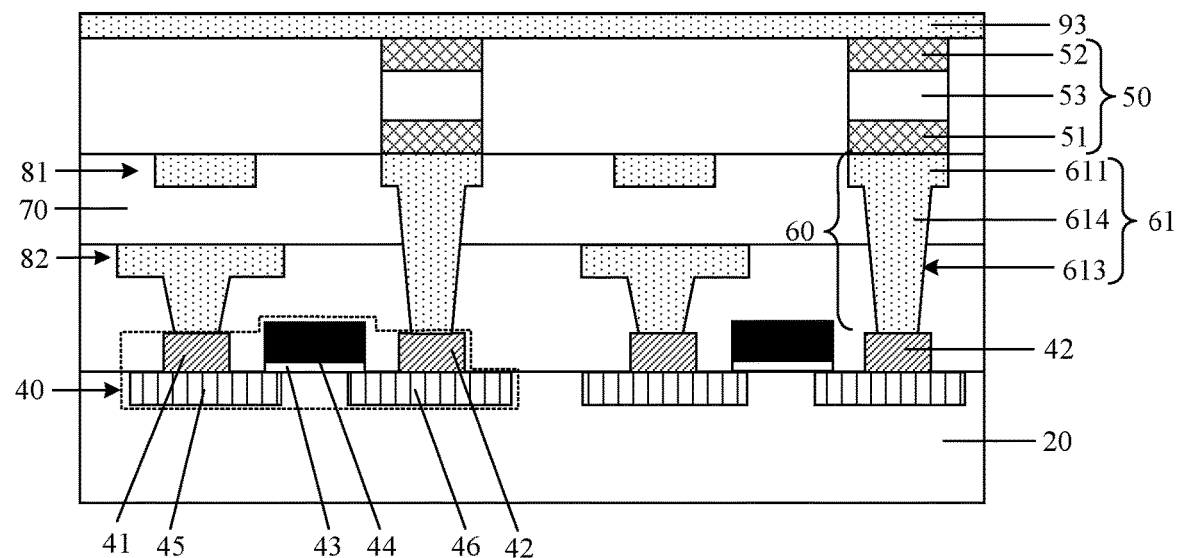
FIG. 22 is a schematic sectional view of a storage unit in another memory according to this application.

As shown in FIG. 22, the MTJ storage element 50 includes a bottom electrode 51, a top electrode 52, and an MTJ 53 located between the bottom electrode 51 and the top electrode 52. The bottom electrode 51 is electrically connected to a drain electrode 42 of the transistor 40 by using a conduction structure 60. A plurality of wiring layers are disposed between the transistor 40 and the MTJ storage element 50 in the storage area 10, and a dielectric layer 70 is filled between adjacent wiring layers and between a wiring layer closest to the transistor 40 and the transistor 40.

Still referring to FIG. 22, the conduction structure 60 includes a first conduction part 61. The first conduction part 61 includes a first metal wire 611 and a first via hole 613. The plurality of wiring layers include a first wiring layer 81 and a second wiring layer 82, and the second wiring layer 82 is disposed between the first wiring layer 81 and the transistor 40. The first wiring layer 81 includes the first metal wire 611, and the first via hole 613 penetrates a dielectric layer 70 and the second wiring layer 82 that are located between the first wiring layer 81 and the transistor 40. A first connection passage 614 is disposed in the first via hole 613, the first connection passage 614 is directly connected to the first metal wire 611 and the drain electrode 42 of the transistor 40, and the first connection passage 614 is not directly connected to a metal wire at the second wiring layer 82.

It should be noted that, for the second wiring layer 82, the first via hole 613 penetrates the second wiring layer 82, but the first connection passage 614 disposed in the first via hole 613 is not directly connected to the metal wire at the second wiring layer 82. That is, no metal wire is disposed at a position that is of the second wiring layer 82 and that is corresponding to the first via hole 613, so as to meet this condition.

Referring to FIG. 22, in addition to the drain electrode 42, the transistor 40 further includes a source electrode 41, a gate dielectric layer 43, and a gate electrode 44. To distinguish between the two electrodes other than the gate electrode 44 of the transistor 40, one electrode is referred to as the source electrode 41, and the other electrode is referred to as the drain electrode 42.

For example, as shown in FIG. 22, the transistor 40 may further include a source electrode region 45 and a drain electrode region 46. The source electrode region 45 is in contact with the source electrode 41, the drain electrode region 46 is in contact with the drain electrode 42, and a region between the source electrode region 45 and the drain electrode region 46 is a passage region. The source electrode region 45 and the drain electrode region 46 may be obtained by performing a doping process on the substrate 20. In this case, the substrate 20 is a semiconductor material.

Optionally, the transistor 40 controls writing, changing, or reading of information in the storage unit 30. That is, the transistor 40 is used as a selector device to control writing, changing, or reading of information in the storage unit 30.

In the memory, in the conduction structure 60 used to electrically connect the drain electrode 42 of the transistor 40 to the bottom electrode 51 of the MTJ storage element 50, the first via hole 613 of the first conduction part 61 penetrates the second wiring layer 82 between the first wiring layer 81 and the transistor 40, so that the first connection passage 614 disposed in the first via hole 613 is directly connected to the first metal wire 611 and the drain electrode 42 of the transistor 40. Therefore, compared with the case that the first metal wire 611 and the drain electrode 42 of the transistor 40 are electrically connected by using the metal wire that is located between the first metal wire 611 and the drain electrode 42 of the transistor 40 and that is disposed at the second wiring layer 82, space occupied by the metal wire at the second wiring layer 82 can be released in this application. On this basis, in one aspect, the space released by the second wiring layer 82 may be used for circuit wiring, so as to ease overall circuit wiring congestion. In another aspect, after a metal wire that is on the second wiring layer 82 and that is used to connect the drain electrode 42 to the first metal wire 611 is omitted, when a minimum distance of wiring is met, an area occupied by each storage unit 30 can be reduced, and therefore, integration density of the memory can be improved. In still another aspect, resistance of the via hole mainly comes from an interface between the via hole and a metal in contact with a lower part (close to the substrate 20) of the via hole. In this application, because the first via hole 613 crosses the second wiring layer 82, no interface exists between the first via hole 613 and the metal wire at the second wiring layer 82, lower resistance is caused, and a parasitic capacitance can be reduced, thereby improving overall performance of the memory.

Figure 23:
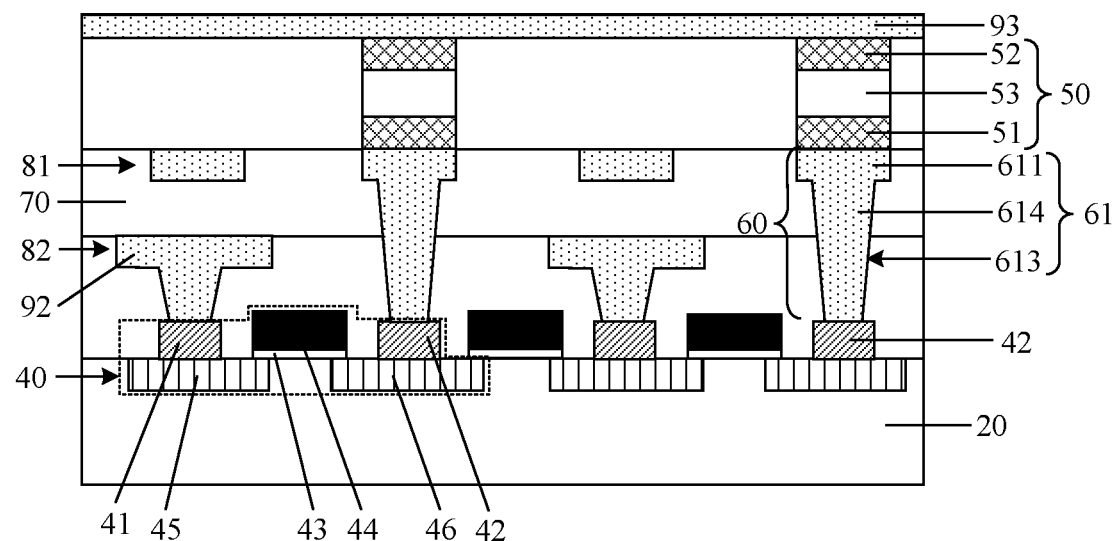
FIG. 23 is a schematic sectional view of a storage unit in another memory according to this application.

Optionally, when the source electrode 41 and the drain electrode 42 of the transistor 40 are symmetrical, the source electrode 41 and the drain electrode 42 are not different. Therefore, as shown in FIG. 23, transistors 40 in two adjacent storage units 30 may share a drain electrode 42. Therefore, integration density of the memory can be further improved.

Figure 24:
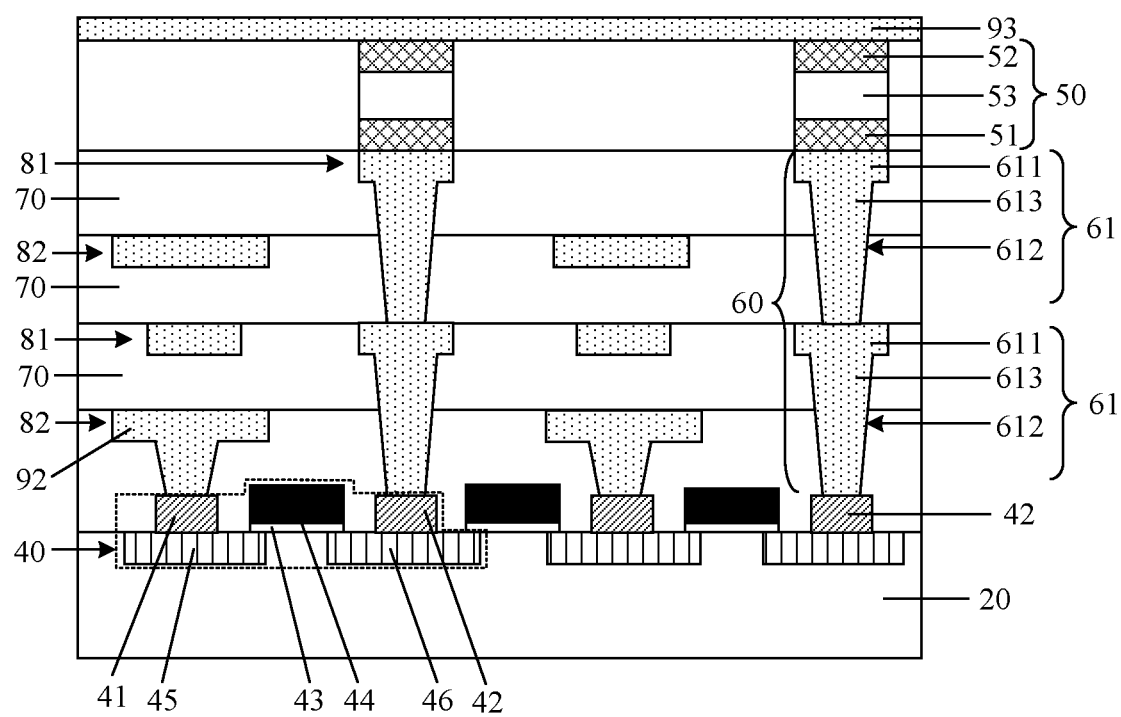
FIG. 24 is a schematic sectional view of a storage unit in another memory according to this application.

Optionally, as shown in FIG. 24, there are at least two first conduction parts 61, and all the first conduction parts 61 are disposed along a thickness direction of the substrate 20. Any adjacent first conduction parts 61 are directly connected.

Based on different positions of the MTJ storage element 50, in particular, when the MTJ storage element 50 is integrated in a back end of line process, at least two first conduction parts 61 may be disposed in the conduction structure 60, so as to improve integration density of the memory.

Figure 25:
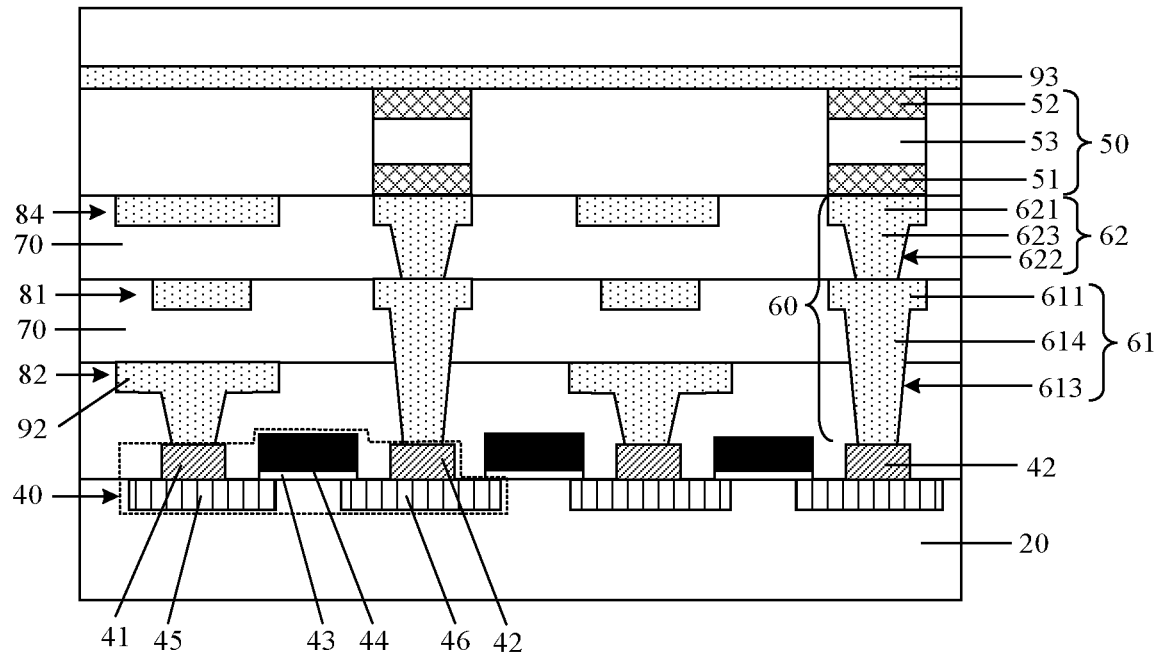
FIG. 25 is a schematic sectional view of a storage unit in another memory according to this application.

Optionally, as shown in FIG. 25, the conduction structure 60 further includes a second conduction part 62. The second conduction part 62 is disposed on a side of the first conduction part 61 away from the substrate 20. The second conduction part 62 includes a fourth metal wire 621 and a fourth via hole 622. The plurality of wiring layers further include a fourth wiring layer 84, and the fourth wiring layer 84 includes a fourth metal wire 621. The fourth via hole 622 penetrates a dielectric layer 70 between the fourth wiring layer 84 and the first conduction part 61. A fourth connection passage 623 is disposed in the fourth via hole 622, and the fourth connection passage 623 is directly connected to the fourth metal wire 621 and the first metal wire 611.

A length direction of the fourth metal wire 621 may be parallel to a length direction of the first metal wire 611.

It should be noted that the fourth via hole 622 penetrates the dielectric layer 70 between the fourth wiring layer 84 and the first conduction part 61, and the fourth connection passage 623 is directly connected to the fourth metal wire 621 and the first metal wire 611. Therefore, it may be learned that the fourth wiring layer 84 and the first wiring layer 81 are disposed adjacent to each other in a direction of the substrate 20, and the fourth wiring layer 84 is disposed on a side of the first wiring layer 81 away from the substrate 20. The fourth wiring layer 84 is disposed adjacent to the first wiring layer 81, that is, no other wiring layer is disposed between the fourth wiring layer 84 and the first wiring layer 81.

In addition, regardless of a quantity of first conduction parts 61, all first conduction parts 61 should be considered as a whole, and the second conduction part 62 is disposed between the first conduction part 61 and the MTJ storage element 50. That is, when there are a plurality of first conduction parts 61, the second conduction part 62 is disposed between a first conduction part 61 closest to the MTJ storage element 50 and the MTJ storage element 50.

Figure 26:
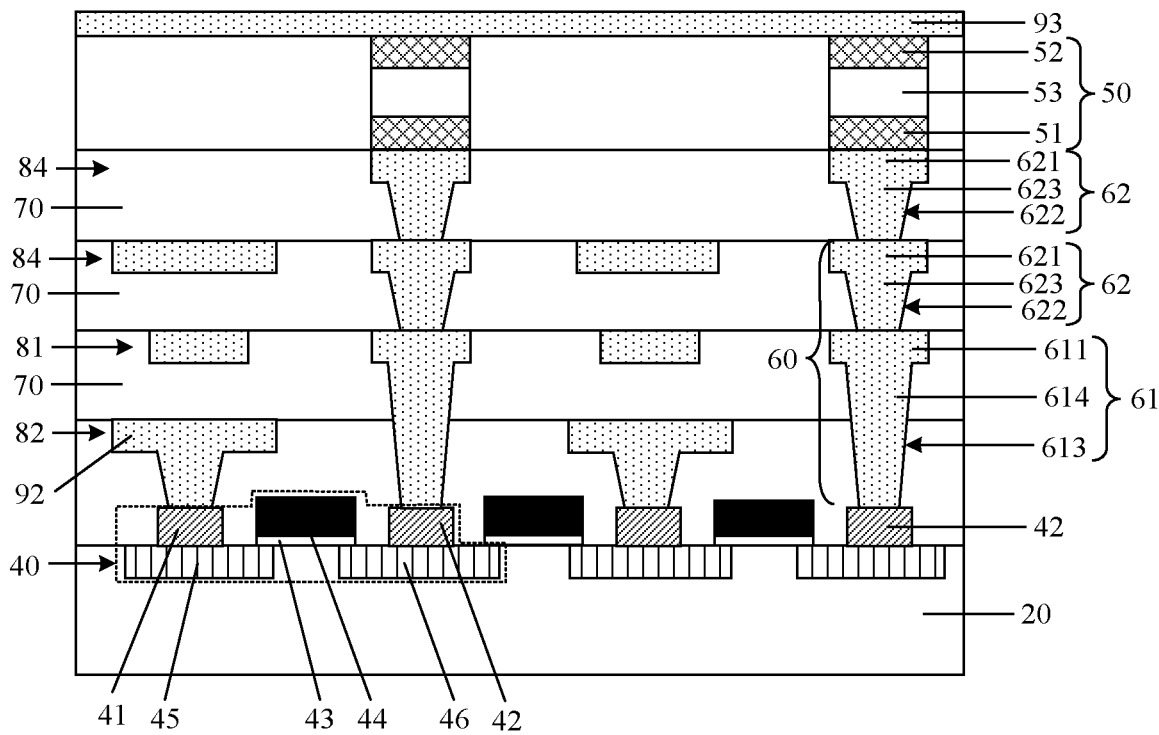
FIG. 26 is a schematic sectional view of a storage unit in another memory according to this application.

Optionally, as shown in FIG. 26, there are at least two second conduction parts 62, and all the second conduction parts 62 are disposed along the thickness direction of the substrate 20. In all the second conduction parts 62, a fourth connection passage 623 in a second conduction part 62 closest to the first conduction part 61 is directly connected to the fourth metal wire 621 and the first metal wire 611. In any adjacent second conduction parts 62, a fourth metal wire 621 and a fourth connection passage 623 that separately belong to the adjacent second conduction parts 62 are directly connected.

FIG. 26 is a schematic diagram by using an example in which two second conduction parts 62 are disposed in a conduction structure 60.

Figure 27:
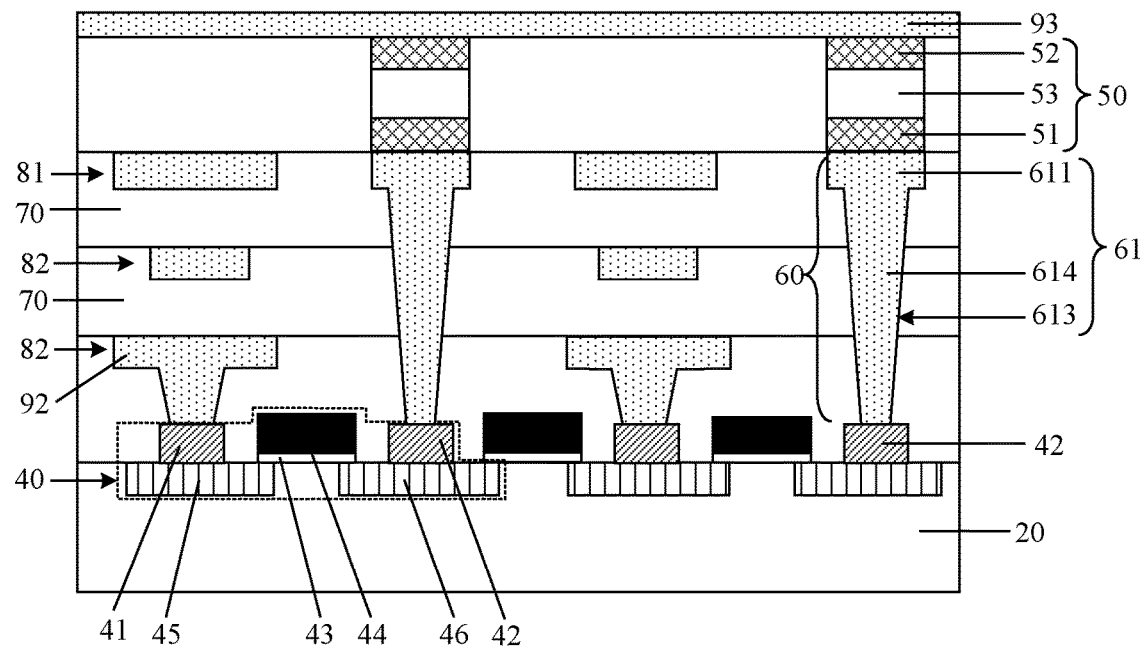
FIG. 27 is a schematic sectional view of a storage unit in another memory according to this application.

Optionally, the first via hole 613 penetrates one second wiring layer 82 (shown in FIG. 23) or two second wiring layers 82 (shown in FIG. 27) between the first wiring layer 81 and the transistor 40.

Figure 28:
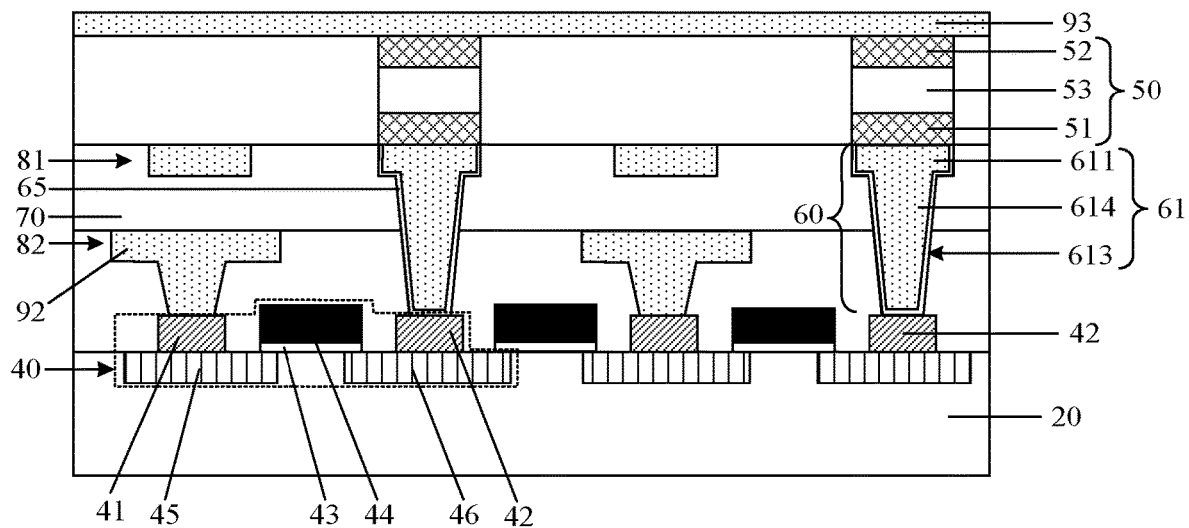
FIG. 28 is a schematic sectional view of a storage unit in another memory according to this application.

Optionally, as shown in FIG. 28, in each first conduction part 61, the first connection passage 614 and the first metal wire 611 that is directly connected to the first connection passage 614 form an integrated structure. On this basis, a diffusion barrier layer 65 is disposed on a side surface and a bottom surface of the integrated structure, and the bottom surface is close to the substrate 20. A part of the diffusion barrier layer 65 that is located on a side surface and a bottom surface of the first connection passage 614 is located in the first via hole 613.

Because some interconnect metal materials (such as Cu) are easy to diffuse, resulting in circuit performance degradation or failure, the diffusion barrier layer 65 needs to be disposed to prevent diffusion. For different metal conductive materials, different materials of the diffusion barrier layer 65 need to be used correspondingly, so as to ensure a barrier function of the diffusion barrier layer 65, adhesion to the integrated structure and the dielectric layer 70, and the like.

For example, when a material of the integrated structure is Cu, a TaN/Ta double-layer structure may be used as the diffusion barrier layer 65, or a TaN/Co double-layer structure may be used as the diffusion barrier layer 65.

It should be noted that the interconnect metal material applied to the memory in this application may be Co, Ru, W, or the like, and whether to dispose the diffusion barrier layer 65 may be determined based on diffusivity of these materials.

Figure 29:
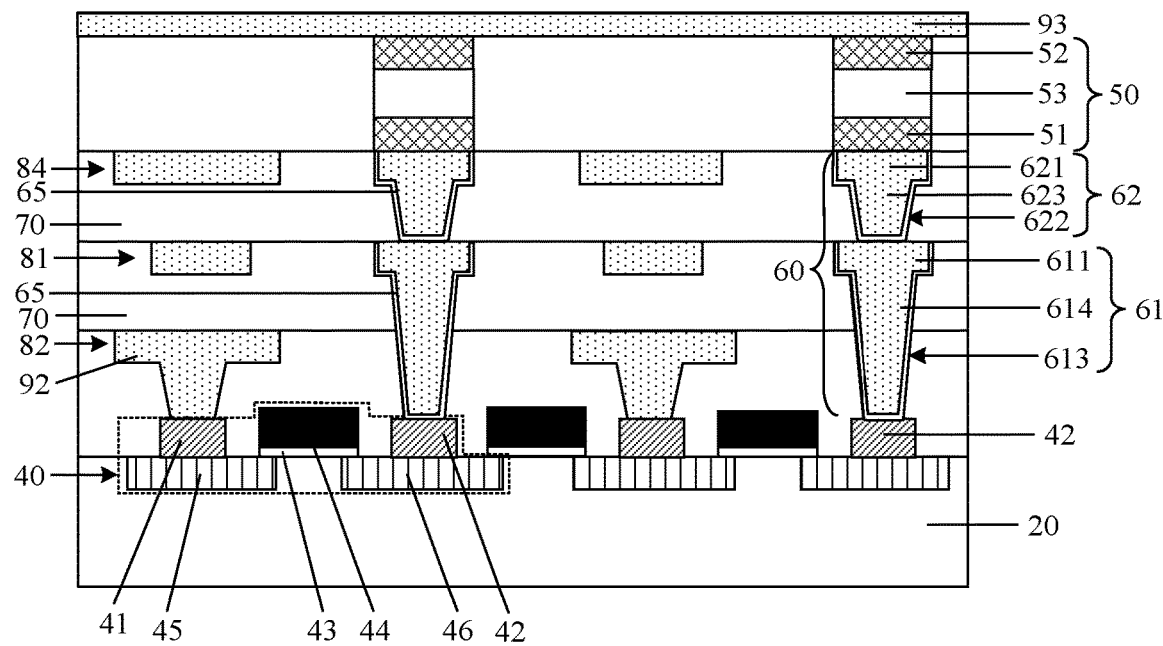
FIG. 29 is a schematic sectional view of a storage unit in another memory according to this application.

Further, optionally, when the conduction structure 60 further includes the second conduction part 62, as shown in FIG. 29, the fourth connection passage 623 and the fourth metal wire 621 form an integrated structure. On this basis, the diffusion barrier layer 65 may be further disposed on a side surface and a bottom surface of the integrated structure including the fourth connection passage 623 and the fourth metal wire 621, and the bottom surface is close to the substrate 20. A part of the diffusion barrier layer 65 that is located on a side surface and a bottom surface of the fourth connection passage 623 is located in the fourth via hole 622.

Figure 30:
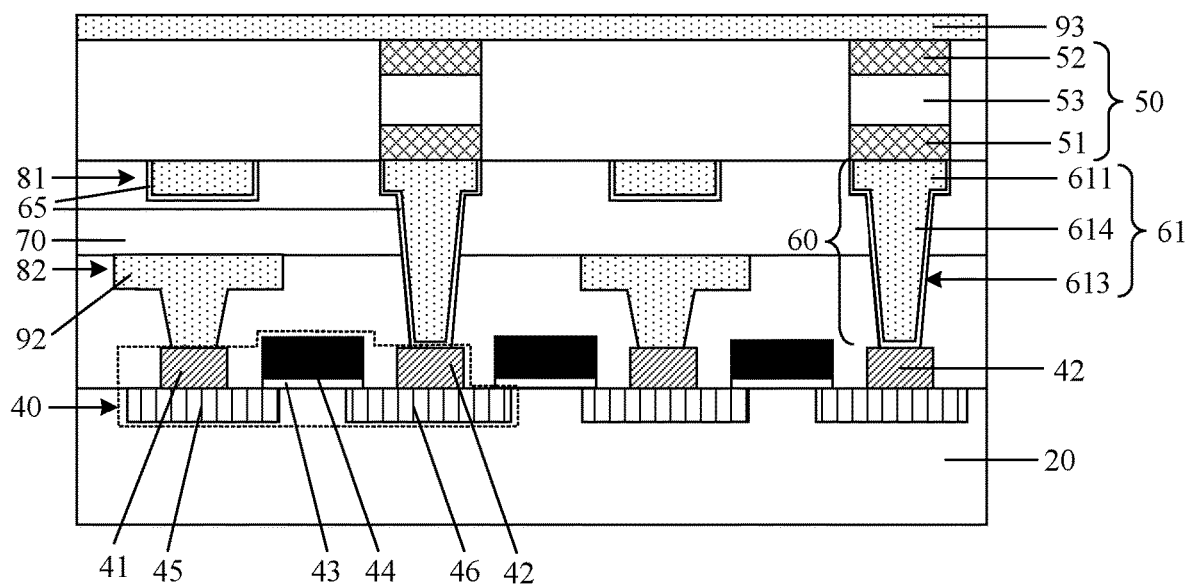
FIG. 30 is a schematic sectional view of a storage unit in another memory according to this application.

It should be noted that the foregoing describes only cases in which the diffusion barrier layer 65 is disposed at a position of the conduction structure 60. For circuit wiring and related via holes, a corresponding diffusion barrier layer 65 may also be disposed based on a used interconnect metal material. Details are not described in this application. FIG. 28 is used as an example. It may be seen from the cross-sectional view that the first wiring layer 81 further has circuit wiring. Therefore, as shown in FIG. 30, the diffusion barrier layer 65 may be disposed on a side surface and a bottom surface of circuit wiring of the third wiring layer 83.

Figure 31:
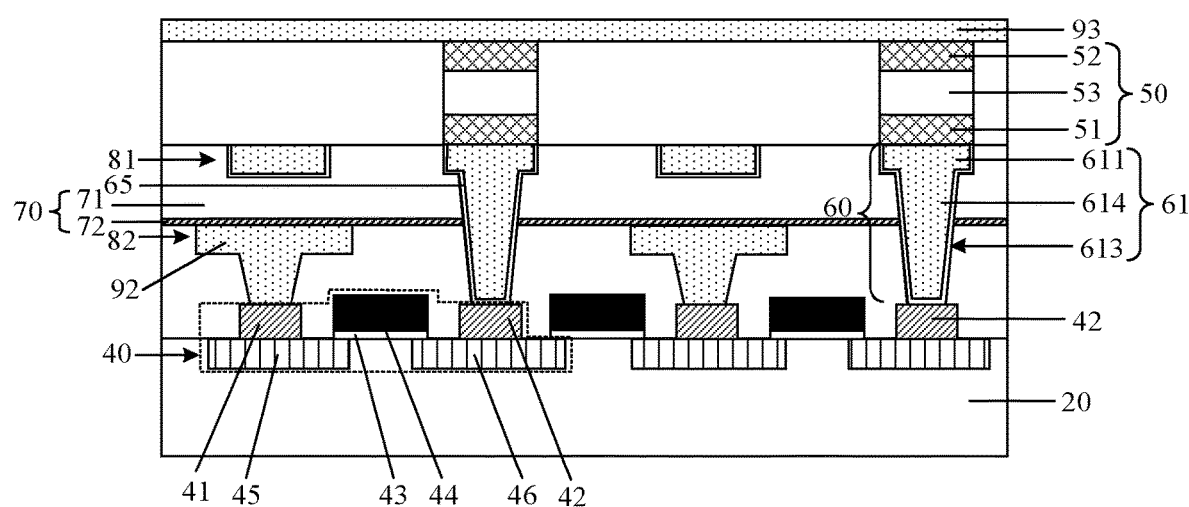
FIG. 31 is a schematic sectional view of a storage unit in another memory according to this application.

Optionally, as shown in FIG. 31, a dielectric layer 70 disposed between adjacent wiring layers includes at least a first sublayer 71 and a second sublayer 72, where the second sublayer 72 is an etch barrier layer and is disposed on a side of the first sublayer 71 close to the substrate 20.

The dielectric layer 70 includes the first sublayer 71 and the second sublayer 72, where the second sublayer 72 is an etch barrier layer and is disposed on the side of the first sublayer 71 close to the substrate 20, thereby avoiding impact on a wiring layer formed when a wiring layer above (that is, a side away from the substrate 20) the dielectric layer 70 is formed.

Further, optionally, a material of the first sublayer 71 is a material of a low dielectric constant or an ultra-low dielectric constant.

When the material of the first sublayer 71 is the material of a low dielectric constant or an ultra-low dielectric constant, a parasitic capacitance between adjacent wiring layers can be reduced.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A memory comprising:
   a substrate; and
   a storage area comprising a plurality of storage units disposed on the substrate, wherein each of the storage units comprises:
      a transistor disposed on the substrate and comprising a drain; and
      a magnetic tunnel junction (MTJ) storage element electrically coupled to the transistor, wherein the MTJ storage element comprises:
         a bottom electrode electrically coupled to the drain using a conduction structure, wherein the conduction structure comprises at least two first conduction parts, and wherein each first conduction part comprises:
            a first metal wire;
            a second metal wire; and
            a first via hole located between the first metal wire and the second metal wire, wherein the first via hole comprises a first connection passage and is directly coupled to the first metal wire and the second metal wire;
         a top electrode; and
         an MTJ disposed between the bottom electrode and the top electrode;
      a plurality of wiring layers disposed between the transistor and the MTJ storage element, wherein the wiring layers comprise:
         a first wiring layer;
         a second wiring layer; and
         two third wiring layers disposed between the first wiring layer and the second wiring layer; and
      a dielectric layer filled between adjacent wiring layers of the wiring layers, wherein the first via hole penetrates the dielectric layer and the third wiring layers, and
      wherein the first connection passage is isolated from metal wires at the third wiring layers.

2. The memory of claim 1, wherein the storage area comprises a second via hole, wherein the second via hole penetrates at least one third wiring layer of the third wiring layers, wherein the first via hole is adjacent to the second via hole, and wherein no metal wire exists on a part of the third wiring layer.

3. The memory of claim 1, wherein the storage area comprises a third via hole, wherein the third via hole comprises a third connection passage coupled to a metal wire at a point of at least one third wiring layer of the third wiring layers, wherein the third via hole starts from the at least one third wiring layer, and wherein the third via hole is adjacent to the first via hole.

4. The memory of claim 1, wherein the conduction structure further comprises a second conduction part disposed between the first conduction part and the MTJ storage element, wherein the second conduction part comprises:
   a fourth metal wire; and
   a fourth via hole comprising a fourth connection passage coupled to the fourth metal wire and the first metal wire, wherein the wiring layers further comprise a fourth wiring layer, and wherein the fourth via hole penetrates the dielectric layer between the fourth wiring layer and the first conduction part.

5. The memory of claim 1, wherein the conduction structure further comprises a third conduction part disposed between the first conduction part and the transistor, wherein the third conduction part comprises a fifth via hole that penetrates the dielectric layer between the first conduction part and the drain, and wherein the fifth via hole comprises a fifth connection passage directly coupled to the drain and the first metal wire.

6. The memory of claim 1, wherein the first connection passage comprises:
   a first side surface; and
   a first bottom surface,
   wherein the first connection passage and the first metal wire form an integrated structure, wherein the integrated structure comprises:
      a second side surface;
      a second bottom surface adjacent to the substrate; and
      a diffusion barrier layer disposed on the second side surface and the second bottom surface, wherein a part of the diffusion barrier layer is located on the first side surface, the first bottom surface, and in the first via hole.

7. The memory of claim 1, wherein the conduction structure further comprises a second conduction part disposed between the first conduction part and the MTJ storage element, wherein the second conduction part comprises:
   a fourth metal wire; and
   a fourth via hole comprising a fourth connection passage coupled to the fourth metal wire and the second metal wire adjacent to the fourth metal wire, wherein the wiring layers further comprise a fourth wiring layer, wherein the fourth via hole penetrates the dielectric layer between the fourth wiring layer and the first conduction part.

8. The memory of claim 1, wherein the conduction structure further comprises a third conduction part disposed between the first conduction part and the transistor, wherein the third conduction part comprises a fifth via hole that penetrates the dielectric layer between the first conduction part and the drain, wherein the fifth via hole comprises a fifth connection passage directly coupled to the drain and the second metal wire.

9. The memory of claim 1, wherein the first connection passage comprises:
a side surface; and
a bottom surface, wherein the first connection passage and the second metal wire form an integrated structure, wherein the integrated structure comprises:
a second side surface;
a second bottom surface adjacent to the substrate; and
a diffusion barrier layer disposed on the side surface of the integrated structure and the bottom surface of the integrated structure, wherein a part of the diffusion barrier layer is located on the side surface of the first connection passage, the bottom surface of the first connection passage, and in the first via hole.

10. The memory of claim 1, wherein the at least two first conduction parts are disposed along a thickness direction of the substrate.

11. The memory of claim 10, wherein any two adjacent first conduction parts of the at least two first conduction parts share the second metal wire.

12. The memory of claim 10, wherein any two adjacent first conduction parts of the at least two first conduction parts share the first metal wire.

13. A memory, comprising:
a substrate; and
a storage area comprising a plurality of storage units disposed on the substrate, wherein each of the storage units comprises:
a transistor disposed on the substrate and comprising a drain; and
a magnetic tunnel junction (MTJ) storage element electrically coupled to the transistor, wherein the MTJ storage element comprises:
a bottom electrode electrically coupled to the drain using a conduction structure, wherein the conduction structure comprises a first conduction part, wherein the first conduction part comprises:
a first metal wire; and
a first via hole directly coupled to the first metal wire and the drain and comprising a first connection passage;
a top electrode; and
an MTJ located between the bottom electrode and the top electrode;
a plurality of wiring layers disposed between the transistor and the MTJ storage element, wherein the wiring layers comprise:
a first wiring layer; and
a second wiring layer disposed between the first wiring layer and the transistor; and
a dielectric layer filled between adjacent wiring layers of the wiring layers and between a wiring layer closest to the transistor and the transistor,
wherein the first via hole penetrates the dielectric layer and the second wiring layer,
wherein the first connection passage is isolated from metal wires at the second wiring layer,
wherein the storage area comprises at least two first conduction parts, and
wherein the at least two first conduction parts are disposed along a thickness direction of the substrate, and any adjacent first conduction parts are directly connected.

14. The memory of claim 13, wherein the first via hole penetrates the second wiring layers.

15. The memory of claim 13, wherein the first connection passage comprises:
a first side surface; and
a first bottom surface, wherein the first connection passage and the first metal wire form an integrated structure, wherein the integrated structure comprises:
a second side surface;
a second bottom surface adjacent to the substrate; and
a diffusion barrier layer disposed on the second side surface and the second bottom surface, wherein a part of the diffusion barrier layer is located on the first side surface, the first bottom surface, and in the first via hole.

16. The memory of claim 13, wherein the conduction structure further comprises a second conduction part disposed on a side that is of the first conduction part and that is away from the substrate, wherein the second conduction part comprises:
a fourth metal wire; and
a fourth via hole comprising a fourth connection passage coupled to the fourth metal wire and the first metal wire or a second metal wire that is adjacent to the fourth metal wire, wherein the wiring layers further comprise a fourth wiring layer, and wherein the fourth via hole penetrates the dielectric layer between the fourth wiring layer and the first conduction part.

17. The memory of claim 16, wherein the storage area comprises at least two second conduction parts disposed along the thickness direction of the substrate, wherein the at least two second conduction parts comprise a fifth connection passage that is closest to the first conduction part and that is directly coupled to the fourth metal wire and the first metal wire, and wherein the fourth metal wire and the fourth connection passage are directly connected in any adjacent second conduction parts of the at least two second conduction parts.

18. A memory comprising:
a substrate; and
a storage area comprising a plurality of storage units disposed on the substrate, wherein each of the storage units comprises:
a transistor disposed on the substrate and comprising a drain; and
a magnetic tunnel junction (MTJ) storage element electrically coupled to the transistor, wherein the MTJ storage element comprises:
a bottom electrode electrically coupled to the drain using a conduction structure, wherein the conduction structure comprises a first conduction part, and wherein the first conduction part comprises:
a first metal wire;
a second metal wire; and
a first via hole located between the first metal wire and the second metal wire, wherein the first via hole comprises a first connection passage and is directly coupled to the first metal wire and the second metal wire;
a top electrode; and
an MTJ disposed between the bottom electrode and the top electrode;

a plurality of wiring layers disposed between the transistor and the MTJ storage element, wherein the wiring layers comprise:
a first wiring layer;
a second wiring layer; and
a third wiring layer disposed between the first wiring layer and the second wiring layer;
a dielectric layer filled between adjacent wiring layers of the wiring layers; and
a second via hole comprising a second connection passage coupled to a metal wire at the third wiring layer, wherein the second via hole starts from the third wiring layer, and wherein the second via hole is adjacent to the first via hole,
wherein the first via hole penetrates the dielectric layer and the third wiring layer, and
wherein the first connection passage is isolated from metal wires at the third wiring layer.

19. The memory of claim 18, wherein the storage area comprises a third via hole, wherein the third via hole penetrates the third wiring layer, wherein the first via hole is adjacent to the third via hole, and wherein no metal wire exists on a part of the third wiring layer.

20. The memory of claim 18, wherein the storage area comprises at least two first conduction parts, wherein the at least two first conduction parts are disposed along a thickness direction of the substrate, and wherein any two adjacent first conduction parts of the at least two first conduction parts share the second metal wire.

* * * * *